(12) United States Patent
Kawahito et al.

(10) Patent No.: US 7,781,811 B2
(45) Date of Patent: *Aug. 24, 2010

(54) SEMICONDUCTOR RANGE-FINDING ELEMENT AND SOLID-STATE IMAGING DEVICE

(75) Inventors: Shoji Kawahito, Hamamatsu (JP); Mitsuru Homma, Fukuyama (JP)

(73) Assignees: National University Corporation Shizuoka University, Shizuoka-shi (JP); Sharp Kabushiki Kaisha, Osaka-shi (JP)

( * ) Notice: Subject to any disclaimer, the term of this patent is extended or adjusted under 35 U.S.C. 154(b) by 219 days.

This patent is subject to a terminal disclaimer.

(21) Appl. No.: 12/065,156

(22) PCT Filed: Aug. 30, 2006

(86) PCT No.: PCT/JP2006/317131

§ 371 (c)(1),
(2), (4) Date: Feb. 28, 2008

(87) PCT Pub. No.: WO2007/026779

PCT Pub. Date: Mar. 8, 2007

(65) Prior Publication Data

US 2009/0134396 A1    May 28, 2009

(30) Foreign Application Priority Data

Aug. 30, 2005   (JP) .............................. 2005-250298

(51) Int. Cl.
  *H01L 31/062* (2006.01)
(52) U.S. Cl. ................. 257/292; 257/E27.133
(58) Field of Classification Search .................. 257/292, 257/E27.133

See application file for complete search history.

(56) References Cited

U.S. PATENT DOCUMENTS

2006/0192938 A1    8/2006   Kawahito (Continued)

FOREIGN PATENT DOCUMENTS

JP          4 211180           8/1992

(Continued)

OTHER PUBLICATIONS

Sawada, et al., "Haikei Hikari Teigen KOZO O Motsu QVGA Size TOF Kyori Gazo Sensor", ITE Technical Report, vol. 30, No. 25, pp. 13-16, 2006.

(Continued)

*Primary Examiner*—Tu-Tu V Ho
(74) *Attorney, Agent, or Firm*—Oblon, Spivak, McClelland, Maier & Neustadt, L.L.P.

(57) ABSTRACT

To transfer signal charges generated by a semiconductor photoelectric conversion element in opposite directions, the center line of a first transfer gate electrode and that of a second transfer gate electrodes are arranged on the same straight line, and a U-shaped first exhausting gate electrode and a second exhausting gate electrode are arranged to oppose to each other. The first exhausting gate electrode exhausts background charges generated by a background light in the charge generation region, and the second exhausting gate electrode exhausts background charges generated by the background light in the charge generation region. The background charges exhausted by the first exhausting gate electrode are received by a first exhausting drain region and the background charges exhausted by the second exhausting gate electrode are received by a first exhausting drain region.

20 Claims, 16 Drawing Sheets

U.S. PATENT DOCUMENTS

2007/0103569 A1 5/2007 Kawahito
2007/0158770 A1 7/2007 Kawahito
2009/0230437 A1* 9/2009 Kawahito et al. ........... 257/226

FOREIGN PATENT DOCUMENTS

| JP | 2001 194458 | 7/2001 |
| JP | 2001 326378 | 11/2001 |
| JP | 2002 368205 | 12/2002 |
| JP | 2004 294420 | 10/2004 |
| WO | 2005 078386 | 8/2005 |

OTHER PUBLICATIONS

Izhal, et al., "A CMOS Time-of-Flight Range Image Sensor with Gates on Field Oxide Structure", IEEE Sensors, pp. 141-144, 2005.

Miyagawa, et al., "CCD-Based Range-Finding Sensor", IEEE Transactions on Electron Devices, vol. 44, No. 10, pp. 1648-1652, 1997.

U.S. Appl. No. 11/577,546, filed Apr. 19, 2007, Kawahito.

U.S. Appl. No. 12/065,158, filed Feb. 28, 2008, Kawahito, et al.

U.S. Appl. No. 12/516,635, filed May 28, 2009, Kawahito.

* cited by examiner

FIG. 8
(a)
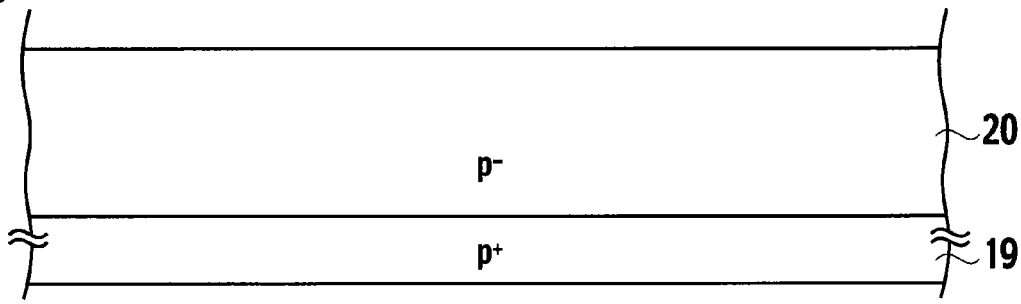
(b)
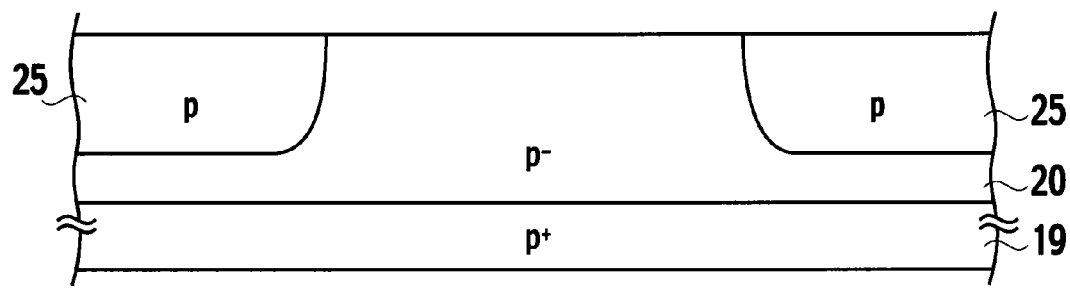
(c)
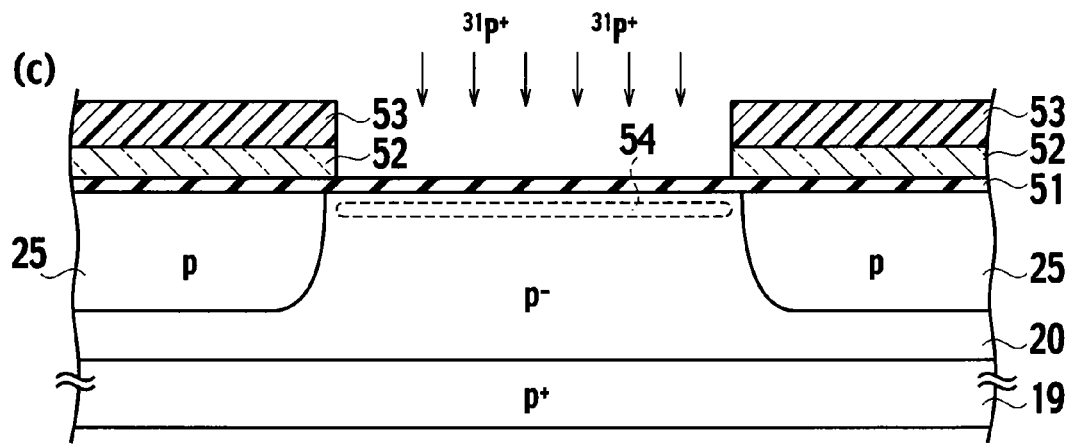
(d)
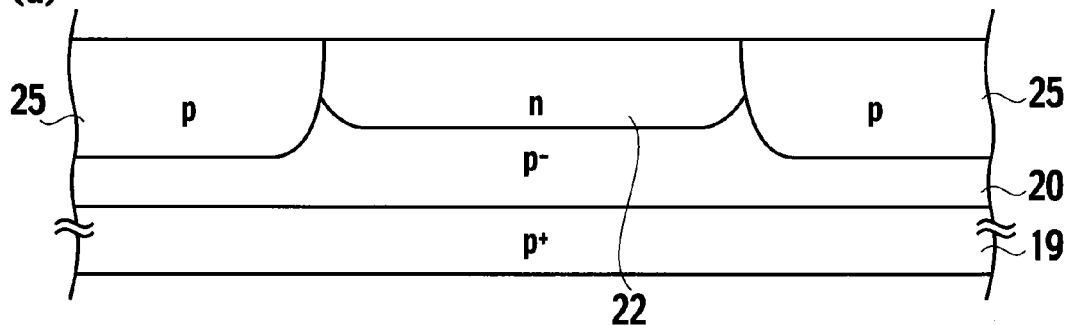

FIG. 10
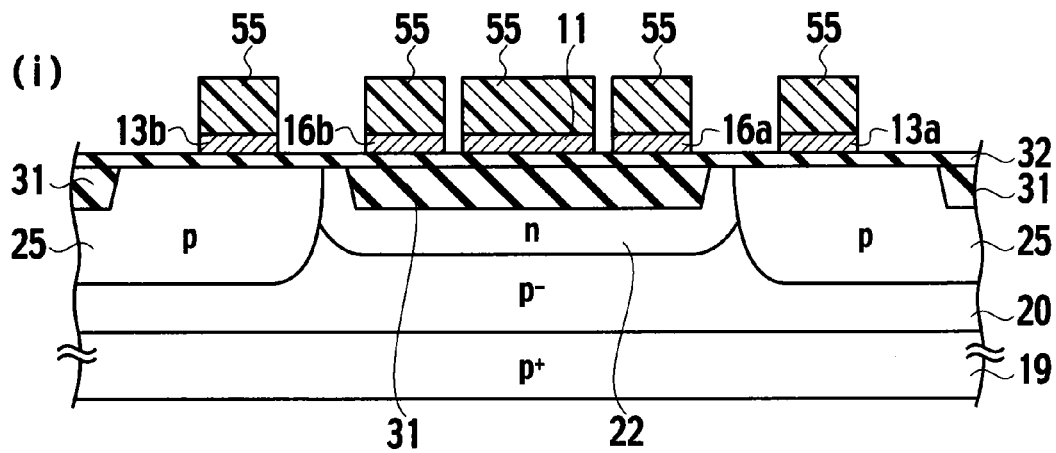
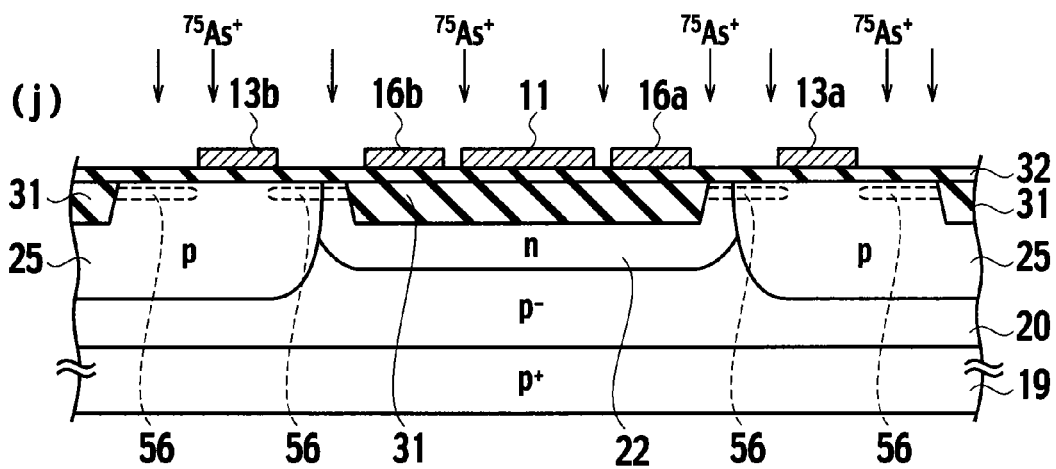
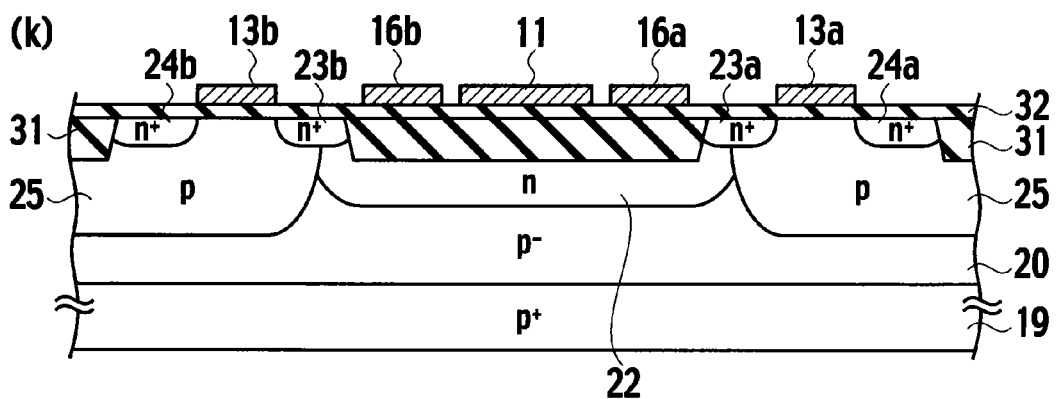

FIG. 14
(a)
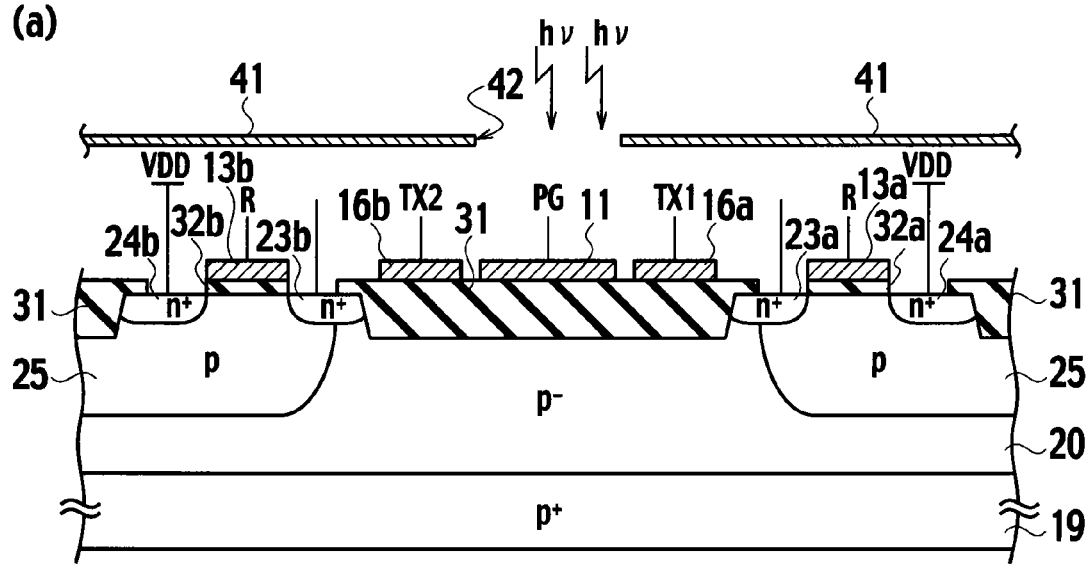
(b)
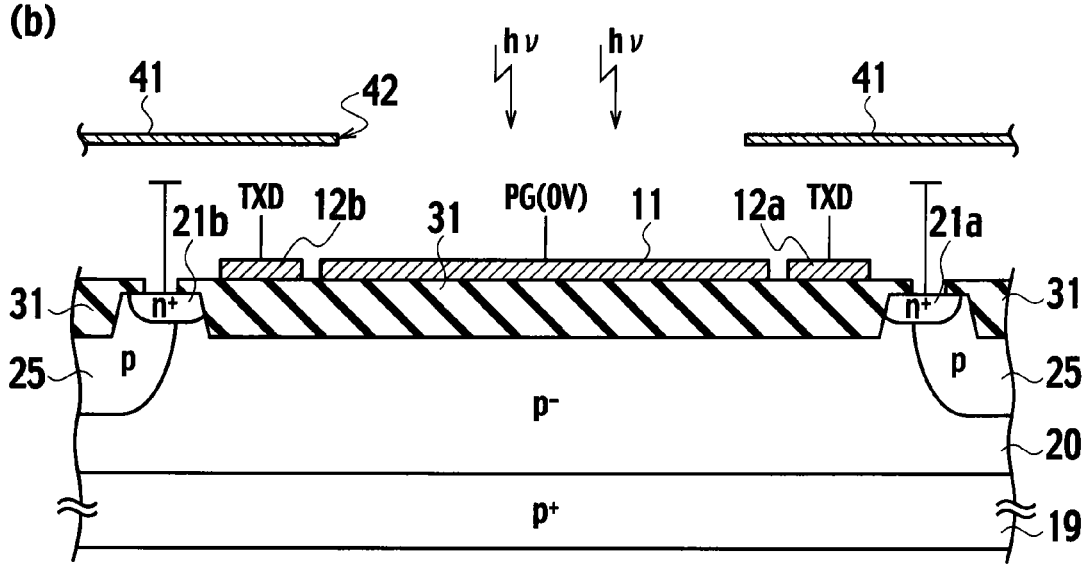

FIG. 15
(a)
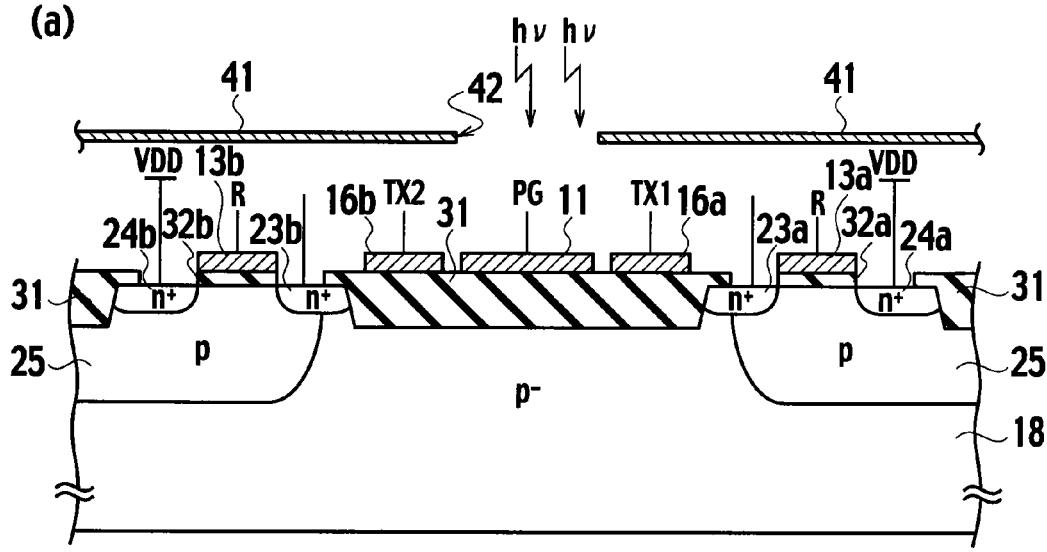
(b)
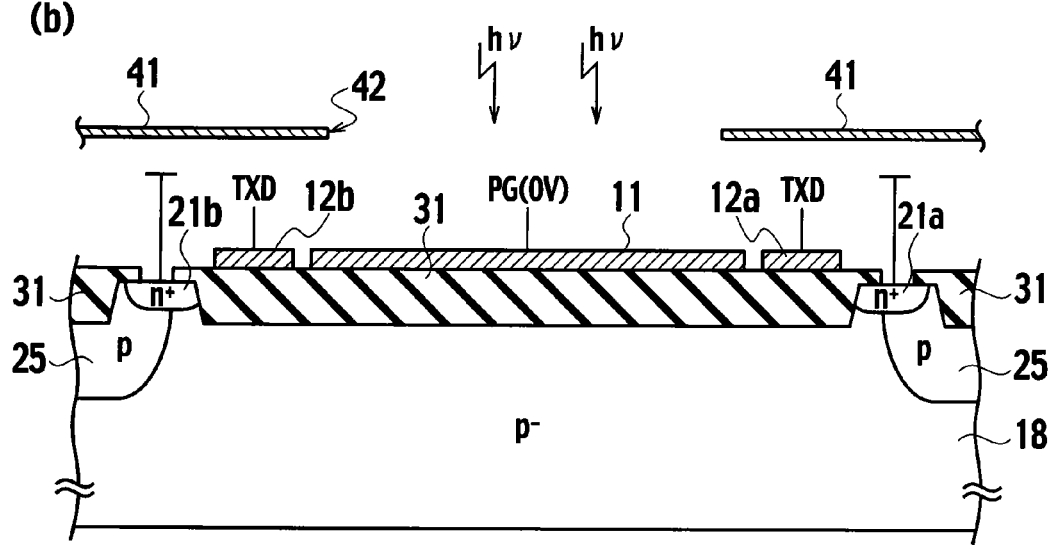

US 7,781,811 B2

SEMICONDUCTOR RANGE-FINDING ELEMENT AND SOLID-STATE IMAGING DEVICE

FIELD OF THE INVENTION

The present invention relates to a semiconductor range-finding element and a solid-state imaging device in which semiconductor range-finding elements are arrayed one-dimensionally or two-dimensionally.

DESCRIPTION OF THE RELATED ART

As reported by R. Miyagawa et al., "CCD-Based Range-Finding Sensor", IEEE Transaction on Electron Devices, October 1997, Vol. 44, No. 10, pp. 1648-1652, with a pioneering report of one-dimensional CCD range-finding sensor, which has been firstly reported in 1997, the development of time-of-flight (TOF) type range-finding sensors using time-of-flight of light and obtaining range images are advancing in many fields.

However, the resolution of the currently available TOF range-finding sensor remains within about 20,000 pixels. Also, in the case of using the CCD, as the number of the pixels is increased, it becomes difficult to drive the pixels. In the hybrid method of combining CMOS manufacturing process and CCD manufacturing process, its manufacturing cost becomes expensive.

On the other hand, as described in Japanese Laid Open Patent Application (JP 2004-294420A), the entire contents of which are incorporated by reference in this specification, one of the inventors has already proposed a method that is effective for a higher sensitivity and based on a CMOS technique for carrying out a charge transfer at a high speed.

SUMMARY OF THE INVENTION

However, the earlier TOF range-finding sensors could not effectively reduce the influence of background light. When the background light is included in a signal, the light contains shot noise. Thus, when there are bias charges caused by the background light, the shot noise causes the drop in a range measurement precision. Also, for example, when 10000 electrons are assumed to remain in a floating drain region of the time-of-flight (TOF) type range-finding sensor, if this is occupied by 5000 background charges, only 5000 signal charges remain which results in the drop in a dynamic range. When the dynamic range is assumed to be represented by the maximum value for the signal and the noise level, the increase in the noise leads to the decrease in the dynamic range.

It is an object of the present invention to provide a TOF type semiconductor range-finding element, by effectively reducing the influence of a background light, which has a high range measurement precision (distance resolution), a wide maximum range measurement coverage and a wide dynamic range, and a TOF type solid-state imaging device in which a plurality of TOF type semiconductor range-finding elements are arranged in one-dimensionally or two-dimensionally.

In order to achieve above-mentioned object, the first aspect of the present invention inheres in a semiconductor range-finding element encompassing (a) a semiconductor photoelectric conversion element configured to receive an optical pulse, which is reflected by a target sample, as an optical signal, and configured to convert into a) signal charges in a charge generation region; (b) first and second transfer gate electrodes configured to electrostatically control potentials of first and second transfer channels implemented by a same semiconductor region as the charge generation region through insulating films formed on the first and second transfer channels, respectively, and configured to alternately transfer the signal charges generated in the charge generation region, through the first and second transfer channels; (c) first and second floating drain regions configured to accumulate the signal charges transferred by the first and second transfer gate electrodes, sequentially and respectively; (d) a first exhausting gate electrode configured to electrostatically control a potential of a first exhausting channel implemented by the same semiconductor region as the charge generation region through the insulating film formed on the first exhausting channel and configured to receive a background light and then to exhaust background charges generated in the charge generation region; and (e) a first exhausting drain region configured to receive the background charges exhausted by the first exhausting gate electrode. In accordance with the semiconductor range-finding element pertaining to the first aspect, by sequentially applying control pulse signals to the first gate electrode, the second transfer gate electrode and the first exhausting gate electrode in synchronization with the optical pulse so as to operate the first gate electrode, the second transfer gate electrode and the first exhausting gate electrode, a range to the target sample is measured in accordance with a distribution ratio between the charges accumulated in the first and second floating drain regions. Here, as "the claimed insulating film", a silicon oxide film ($SiO_2$ film) is preferable. However, the use of various insulating films other than the silicon oxide film ($SiO_2$ film) is not inhibited. That is, the first and second transfer gate electrodes typically have the insulating gate structure of insulating gate type transistors (MIS transistors) having the various insulating films. For example, in a case of the ONO film implemented by the triple-layer composite film of silicon oxide film ($SiO_2$ film)/silicon nitride film ($Si_3N_4$ film)/silicon oxide film ($SiO_2$ film), a dielectric constant of approximately $\in_r = 5$ to 5.5 is obtained. Moreover, the single layer film made of any one of a strontium oxide (SrO) film of $\in_r = 6$, a silicon nitride ($Si_3N_4$) film of $\in_r = 7$, an aluminum oxide ($Al_2O_3$) film of $\in_r = 8$ to 11, a magnesium oxide (MgO) film of $\in_r = 10$, a yttrium oxide ($Y_2O_3$) film of $\in_r = 16$ to 17, a hafnium oxide ($HfO_2$) film of $\in_r = 22$ to 23, a zirconium oxide ($ZrO_2$) film of $\in_r = 22$ to 23, a tantalum oxide ($Ta_2O_5$) film of $\in_r = 25$ to 27, and a bismuth oxide ($Bi_2O_3$) film of $\in_r = 40$, or a composite film in which the plurality of foregoing materials are laminated can be used as the gate insulating film of the MIS transistor. $Ta_2O_5$ and $Bi_2O_3$ are poor in thermal stability on the interface with poly-crystal silicon. By the way, since the values of the exemplified respective dielectric constants $\in_r$ may be changed depending on the manufacturing method, they may depart from those values, depending on a case. Moreover, a composite gate insulating film embracing one of those films and a silicon oxide film may be used. The composite film may have a stacked structure of triple layers or more. That is, at least, the gate insulating film that partially includes the material having the foregoing dielectric constant $\in_r$ of 5 to 6 or more is preferred. However, in the case of the composite film, it is preferred to select the combination in which the effective dielectric constant $\in_{reff}$ measured as the entire gate insulating film is 5 to 6 or more. Also, the gate insulating film made of ternary-based compound such as a hafnium aluminate (HfAlO) film may be used. That is, the oxide, which at least includes any one element of strontium (Sr), Aluminum (Al), magnesium (Mg), yttrium (Y), hafnium (Hf), zirconium (Zr), tantalum (Ta) and bismuth (Bi), or the silicon nitride, which includes those elements, can be used as the gate insulating film. By the way, strontium titanate ($SrTiO_3$) of ferroelectric material, barium strontium titanate (BaSrTiO3) and the like can be used as the gate insulating film of a high dielectric constant. However, the lack of the thermal stability on the interface with the poly-crystal silicon and the hysteresis characteristic of the ferroelectric material are required to be considered.

The second aspect of the present invention inheres in a solid-state imaging device, having a plurality of pixels arrayed in a one-dimensional direction, wherein each of the pixels encompasses (a) a semiconductor photoelectric conversion element configured to receive an optical pulse, which is reflected by a target sample, as an optical signal, and configured to convert into signal charges in a charge generation region; (b) first and second transfer gate electrodes configured to electrostatically control potentials of first and second transfer channels implemented by a same semiconductor region as the charge generation region through insulating films formed on the first and second transfer channels, respectively, and configured to alternately transfer the signal charges generated in the charge generation region through the first and second transfer channels; (c) first and second floating drain regions configured to accumulate the signal charges transferred by the first and second transfer gate electrodes, sequentially and respectively; (d) a first exhausting gate electrode configured to electrostatically control a potential of a first exhausting channel implemented by the same semiconductor region as the charge generation region through the insulating film formed on the first exhausting channel and configured to receive a background light and then to exhaust background charges generated in the charge generation region; and (e) a first exhausting drain region configured to receive the background charges exhausted by the first exhausting gate electrode. In accordance with the solid-state imaging device pertaining to the second aspect, control pulse signals are sequentially applied to the first gate electrode, the second transfer gate electrode and the first exhausting gate electrode in all of the pixels, in synchronization with the optical pulse, and in each of the pixels, a range to the target sample is measured in accordance with a distribution ratio between the charges accumulated in the first and second floating drain regions.

The third aspect of the present invention inheres in a solid-state imaging device, having a plurality of pixels arrayed in a shape of a two-dimensional matrix, wherein each of the pixels encompasses (a) a semiconductor photoelectric conversion element configured to receive an optical pulse, which is reflected by a target sample, as an optical signal, and configured to convert into signal charges in a charge generation region; (b) first and second transfer gate electrodes configured to electrostatically control potentials of first and second transfer channels implemented by a same semiconductor region as the charge generation region, through insulating films formed on the first and second transfer channels, respectively, and configured to alternately transfer the signal charges generated in the charge generation region, through the first and second transfer channels; (c) first and second floating drain regions configured to accumulate the signal charges transferred by the first and second transfer gate electrodes, sequentially and respectively; (d) a first exhausting gate electrode configured to electrostatically control a potential of a first exhausting channel implemented by the same semiconductor region as the charge generation region, through the insulating film formed on the first exhausting channel and configured to receive a background light and then to exhaust background charges generated in the charge generation region; and (e) a first exhausting drain region configured to receive the background charges exhausted by the first exhausting gate electrode. In accordance with the solid-state imaging device pertaining to the third aspect, control pulse signals are sequentially applied to the first gate electrode, the second transfer gate electrode and the first exhausting gate electrode in all of the pixels, in synchronization with the optical pulse, and in each of the pixels, a range to the target sample is measured in accordance with a distribution ratio between the charges accumulated in the first and second floating drain regions, and all of the pixels are two-dimensionally accessed, and a two-dimensional picture corresponding to the measured ranges is obtained.

BRIEF DESCRIPTION OF THE DRAWINGS

FIG. 8 is a process-flow cross-sectional view (No. 1) describing a manufacturing method of the semiconductor range-finding element and solid-state imaging device, according to the first embodiment of the present invention;

FIG. 10 is a process-flow cross-sectional view (No. 3) describing the manufacturing method of the semiconductor range-finding element and solid-state imaging device, according to the first embodiment of the present invention;

FIG. 14 is a diagrammatic cross-sectional view describing a schematic configuration of a semiconductor range-finding element serving as a part of pixels in a solid-state imaging device according to a third embodiment of the present invention;

FIG. 15 is a diagrammatic cross-sectional view describing a schematic configuration of a semiconductor range-finding element serving as a part of pixels in a solid-state imaging device according to a fourth embodiment of the present invention.

DETAILED DESCRIPTION OF THE INVENTION

Figure 1:
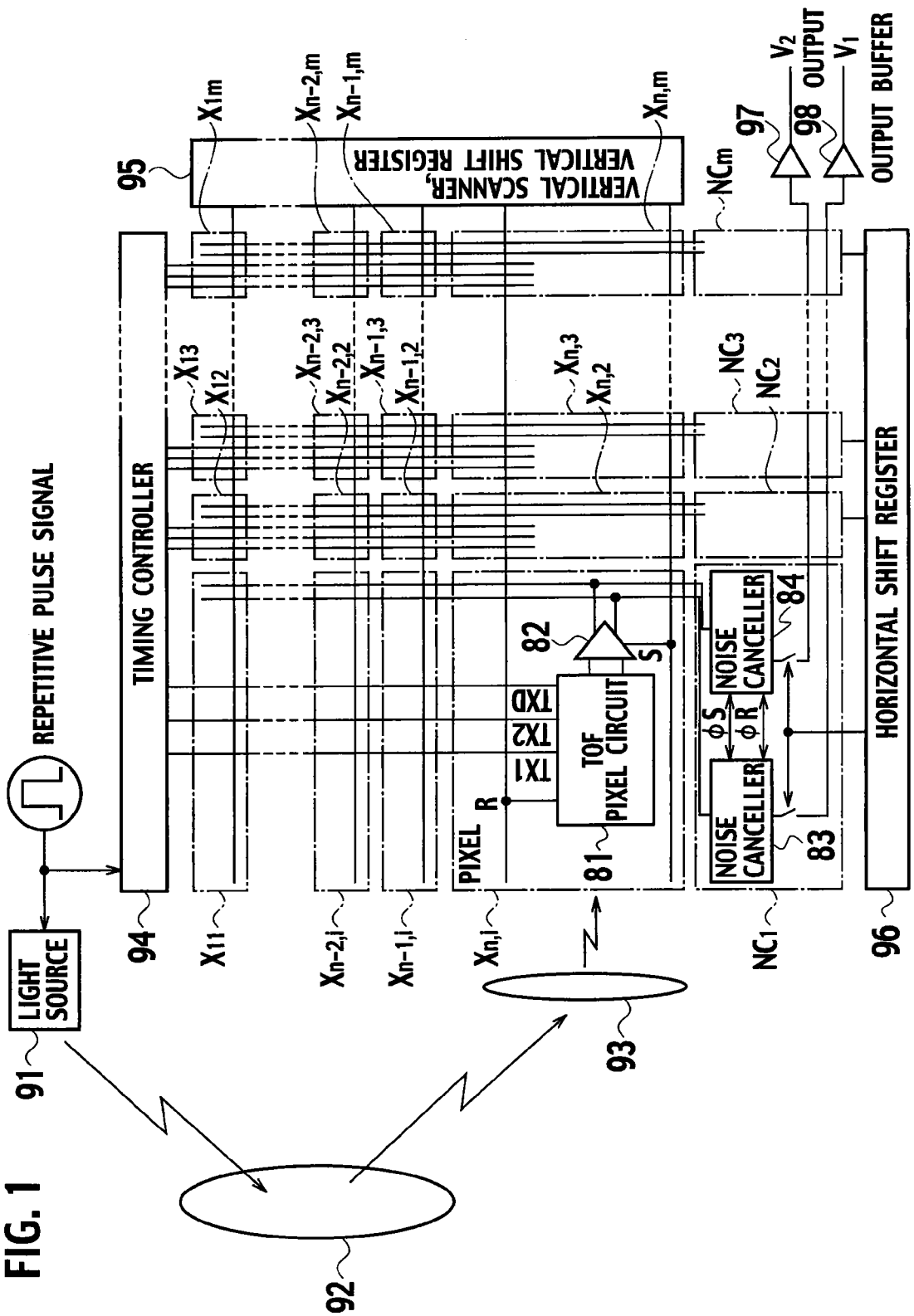
FIG. 1 is a diagrammatic plan view describing a layout on a semiconductor chip of a solid-state imaging device (two-dimensional image sensor) according to a first embodiment of the present a) invention.

The first to fourth embodiments of the present invention will be described below with reference to the drawings. In the notifications of the following drawings, the same or similar reference numerals are applied to the same or similar parts and elements throughout the drawings. However, attention should be paid to the fact that the drawings are only diagrammatic, and the relation between a thickness and a flat surface dimension, a rate between thicknesses of respective layers, and the like are different from actual values. Thus, the specific thicknesses and dimensions should be judged by referring to the following descriptions. Also, it is natural that the portion in which the relation between the mutual dimensions and the rate are different even between the drawings is included.

Also, the following first to fourth embodiments exemplify the apparatuses and methods to embody the technical idea of the present invention, and the technical idea of the present invention does not specify that the materials, shapes, structures, arrangements and the like of members are limited to the followings features. Various changes can be added to the technical idea of the present invention, within the technical range described in claims.

First Embodiment

In a solid-state imaging device (two-dimensional image sensor) according to the first embodiment of the present invention, as shown in FIG. 1, pixel arrays ($X_{11}$ to $X_{1m}$, $X_{21}$ to $X_{2m}$, - - - $X_{n1}$ to $X_{nm}$) and peripheral circuits (94, 95, 96, and $NC_1$ to $NC_m$) are integrated on a same semiconductor chip. A large number of unit pixels $X_{ij}$ (i=1 to m, j=1 to n, and the m, n are integers, respectively) are two-dimensionally arrayed in the pixel arrays, and a rectangular imaging region is implemented. Then, the timing controller 94 is installed on the upper side of this pixel array, and the horizontal shift register 96 is installed on the lower side, respectively along pixel rows $X_{11}$ to $X_{1m}$, $X_{21}$ to $X_{2m}$, - - - , $X_{n1}$ to $X_{nm}$ directions. On the right side of the pixel array, a vertical shift register and a vertical scanner 95 are installed along pixel columns $X_{11}$ to $X_{n1}$, $X_{12}$ to $X_{n2}$, - - - , $X_{1j}$ to $X_{nj}$, - - - $X_{1m}$ to $X_{nm}$ directions. As illustrated an inner structure in the unit pixel $X_{nj}$, each unit pixel $X_{ij}$ embraces a TOF pixel circuit 81 having a photo diode (PD), a charge voltage converting circuit, an integrator and a voltage control pulse delaying circuit and a voltage-read-out buffer amplifier 82. The unit pixels $X_{ij}$ arrayed in the inside of the pixel array are sequentially scanned by the timing controller 94, the horizontal shift register 96 and the vertical shift register and vertical scanner 95. Then, the reading out of pixel signals and an electronic-shuttering operation are executed. That is, the solid-state imaging device according to the first embodiment of the present invention is designed such that, while the pixel array is vertically scanned at the respective pixel rows $X_{11}$ to $X_{1m}$, $X_{21}$ to $X_{2m}$, - - - , $X_{n1}$ to $X_{nm}$ units, the pixel signals on each of the pixel rows $X_{11}$ to $X_{1m}$, $X_{21}$ to $X_{2m}$, - - - , $X_{n1}$ to $X_{nm}$ are read out through the vertical signal lines connected to each of the pixel columns $X_{11}$ to $X_{n1}$, $X_{12}$ to $X_{n2}$, - - - , $X_{1j}$ to $X_{nj}$, - - - , $X_{1m}$ to $X_{nm}$.

The signal read-out operation from the respective unit pixel $X_{11}$ to $X_{1m}$, $X_{21}$ to $X_{2m}$, - - - , $X_{n1}$ to $X_{nm}$ are roughly similar to the earlier CMOS image sensor. However, control signals TX1 ($\phi$1), TX2($\phi$2) for the charge transfers from the respective photodiodes in the respective unit pixels $X_{11}$ to $X_{1m}$, $X_{21}$ to $X_{2m}$, - - - , $X_{n1}$ to $X_{nm}$ are applied to all of the pixels $X_{11}$ to $X_{1m}$, $X_{21}$ to $X_{2m}$, - - - , $X_{n1}$ to $X_{nm}$ by the timing controller 94 at the same time, and because of the signals of high frequencies, switching noises are generated in the periods. Thus, the signal read-out operation from the pixels are executed by providing a signal read-out period after the completion of the processes executed by the noise processing circuits $NC_1$ to $NC_m$.

Figure 2:
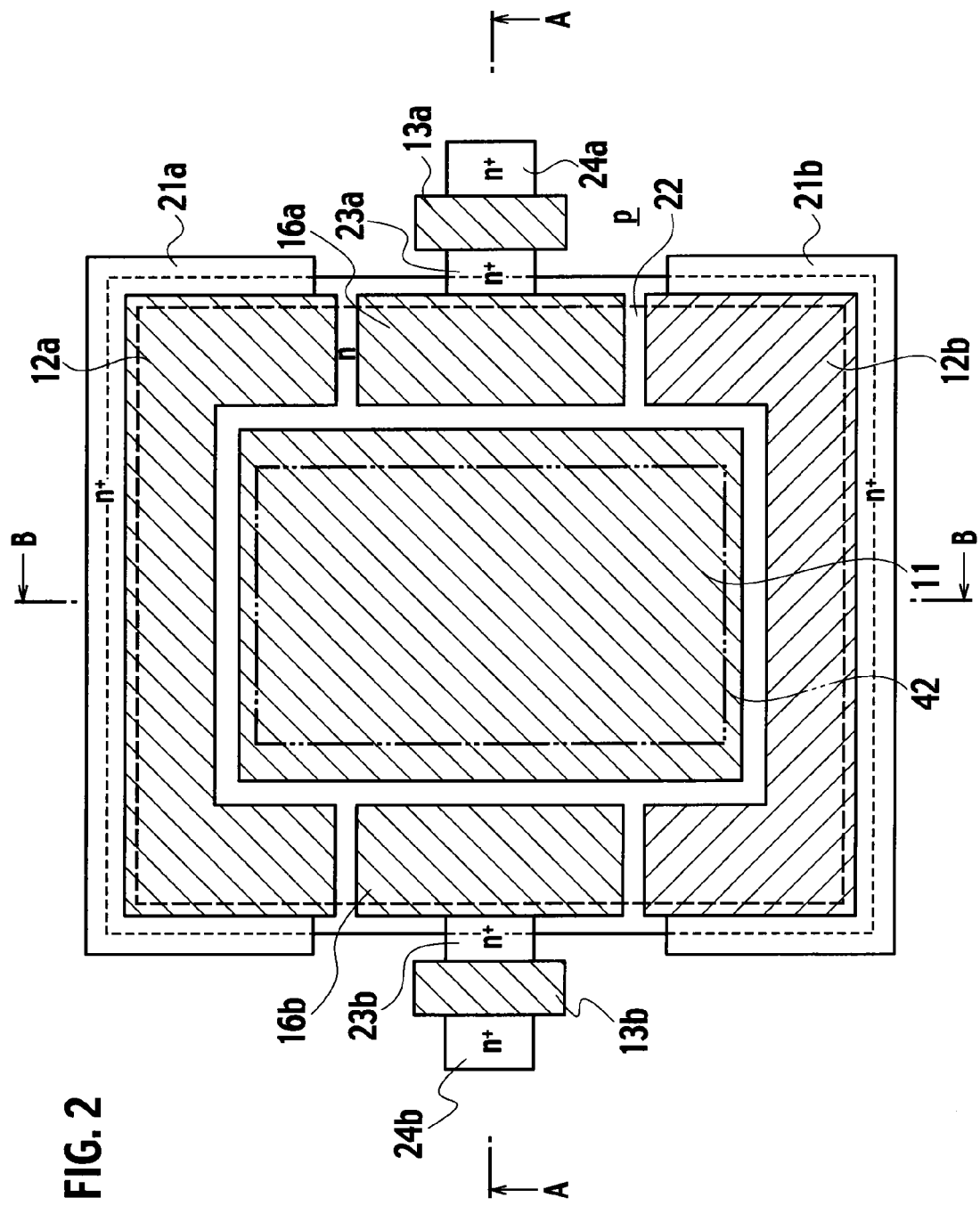
FIG. 2 is a schematic plan view describing a configuration of a semiconductor range-finding element serving as a part of pixels in the solid-state imaging device according to the first embodiment of the present invention.

FIG. 2 shows, as one example, a plan view to explain the physical structure of the TOF pixel circuit 81 assigned in each of the pixels $X_{11}$ to $X_{1m}$, $X_{21}$ to $X_{2m}$, - - - , $X_{n1}$ in the solid-state imaging device (TOF range-finding sensor) according to the first embodiment. A semiconductor photoelectric conversion element is formed directly under a light-receiving gate electrode 11 shown on the center of FIG. 2, and a first transfer gate electrode 16a and a second transfer gate electrode 16b, which transfer the signal charges generated by the semiconductor photoelectric conversion element alternately in right and left directions, are arranged on both sides of the light-receiving gate electrode 11.

Figure 3:
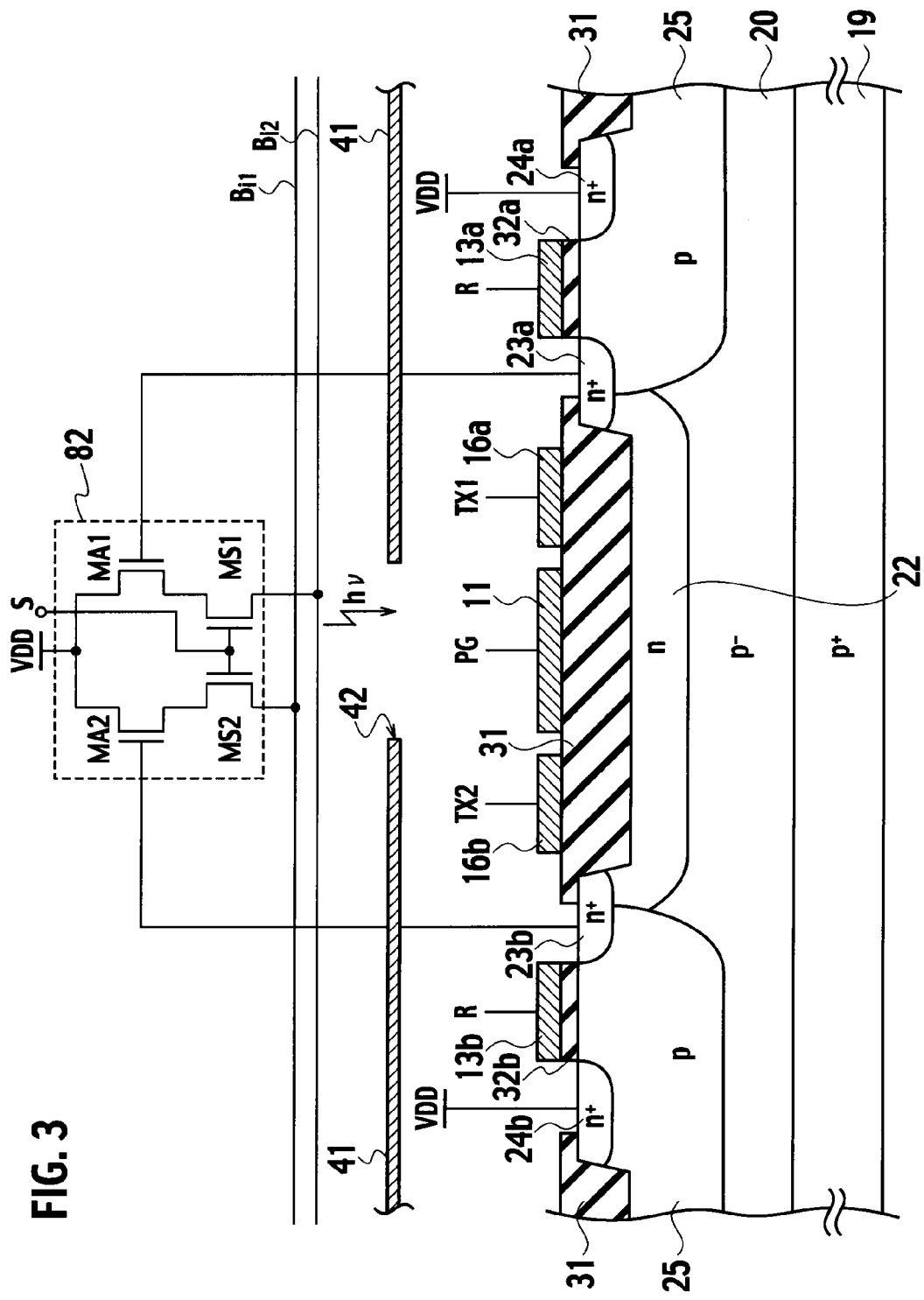
FIG. 3 is a diagrammatic cross-sectional view that is viewed from an A-A direction in FIG. 2.

The light emitted as a repetitive control pulse signals by a light source 91 in FIG. 1 is reflected by a target sample 92 and irradiate on the semiconductor photoelectric conversion element through an opening 42 of a light shielding film (a light shielding film 41 is shown in FIG. 3) indicated by a dot-dashed line going around the periphery of the light-receiving gate electrode 11 in FIG. 2. That is, the semiconductor photoelectric conversion element receives the optical pulse, which is irradiated through the opening 42 of the light shielding film 41, as an optical signal and converts this optical signal into the signal charges.

Moreover, as shown in FIG. 2, a first floating drain region 23a for accumulating the signal charges transferred by the first transfer gate electrode 16a is arranged on the right side, and a second floating drain region 23b for accumulating the signal charges transferred by the second transfer gate electrode 16b is arranged on the left side. A first reset gate electrode 13a adjacent to the first floating drain region 23a and a first reset source region 24a, which is opposite to the first floating drain region 23a with respect to the first reset gate electrode 13a, are further arranged on the right side of FIG. 2. On the other hand, a second reset gate electrode 13b adjacent to the second floating drain region 23b and a second reset source region 24b, which is opposite to the second floating drain region 23b with respect to the second reset gate electrode 13b are further arranged on the left side of FIG. 2. A MOS transistor serving as a first reset transistor is established by the first floating drain region 23a, the first reset gate electrode 13a and the first reset source region 24a, and a MOS transistor serving as a second reset transistor is established by the second floating drain region 23b, the second reset gate electrode 13b and the second reset source region 24b. For the respective first reset gate electrode 13a and second reset gate electrode 13b, control signals R are all set at a high (H) level, and the charges accumulated in the first floating drain region 23a and the second floating drain region 23b are discharged to the first reset source region 24a and the second reset source region 24b, respectively, and the first floating drain region 23a and the second floating drain region 23b are reset.

As shown in FIG. 2, in the semiconductor range-finding element according to the first embodiment, in such a way that the signal charges generated by the semiconductor photoelectric conversion element are transferred in the directions opposite to each other (the right and left directions), on the planar pattern, the respective central lines (not shown) of the first transfer gate electrode 16a and the second transfer gate electrode 16b are aligned on the same straight line A-A, laterally (in the right and left direction) in FIG. 2. Then, the respective widths of the first transfer gate electrode 16a and the second transfer gate electrode 16b, which are measured in the direction orthogonal to the transfer direction of the signal charges (the upper and lower direction in FIG. 2) are made narrower than the width of the light-receiving gate electrode 11 that is measured in the orthogonal direction. Thus, even if the area of the light-receiving region directly under the light-receiving gate electrode 11 is made large, the perfect transfers of the signal charges that are carried out by the first transfer gate electrode 16a and the second transfer gate electrode 16b can be executed.

Along the direction orthogonal to the transfer direction of the signal charges, a first exhausting gate electrode 12a and a second exhausting gate electrode 12b, which are U-shaped in a plan view, are oppositely arranged. That is, as shown in FIG. 2, on the planar pattern, the respective central lines (not shown) of the first exhausting gate electrode 12a and the second exhausting gate electrode 12b are aligned on the same straight line B-B in the vertical direction (the upper and lower direction) in FIG. 2. The first exhausting gate electrode 12a exhausts the background charges, which are generated in the charge generation region by the background light, to the upper direction of FIG. 2, and the second exhausting gate electrode 12b exhausts the background charges, which are generated in the charge generation region by the background light, to the lower direction of FIG. 2. The background charges exhausted by the first exhausting gate electrode 12a are received by a first exhausting drain region 21a allocated at upper direction of FIG. 2, and the background charges exhausted by the second exhausting gate electrode 12b are received by a second exhausting drain region 21b allocated at lower direction of FIG. 2.

FIG. 3 is a cross-sectional configuration viewed from the A-A direction of the semiconductor range-finding element shown in FIG. 2 and shows a semiconductor substrate 19 of a first conductivity type (p-type), a semiconductor layer (epitaxial growth layer) 20 of the first conductivity type (p-type) arranged on the semiconductor substrate 19, and a surface buried region 22 of a second conductivity type (n-type) arranged on the semiconductor layer (epitaxial growth layer) 20. The semiconductor photoelectric conversion element is implemented by an insulating film 31 directly under the light-receiving gate electrode 11 in the central portion, the surface buried region 22, the semiconductor layer (epitaxial growth layer) 20 and the semiconductor substrate 19. A part of the semiconductor layer (epitaxial growth layer) 20 of the first conductivity type (p-type) located directly under the light-receiving gate electrode 11 serves as the charge generation region of the semiconductor photoelectric conversion element. The carriers (electrons) generated in the charge generation region are injected into a sub-area of the surface buried region 22 directly over the charge generation region.

The insulating film 31 extends from directly under the light-receiving gate electrode 11 to under the first transfer gate electrode 16a and the second transfer gate electrode 16b in the right and left portion. Below this insulating film 31, the surface buried region 22 is arranged to extend from directly under the light-receiving gate electrode 11 to under the first transfer gate electrode 16a and the second transfer gate electrode 16b in the right and left directions. That is, in the surface buried region (another sub-area of the surface buried region 22) 22 adjacent to the right side of the surface buried region 22 directly under the light-receiving gate electrode 11 (directly over the charge generation region), the site located directly under the first transfer gate electrode 16a serves as a first transfer channel. On the other hand, in the surface buried region (a still another sub-area of the surface buried region 22) 22 adjacent to the left side of the surface buried region 22 directly under the light-receiving gate electrode 11 (directly over the charge generation region), the site located directly under the second transfer gate electrode 16b serves as a second transfer channel. Then, the first transfer gate electrode 16a and the second transfer gate electrode 16b electrostatically control the potentials of the first and second transfer channels through the insulating films 31 formed on those first and second transfer channels, respectively, and transfer the signal charges alternately through the first and second transfer channels to the first floating drain region 23a and the second floating drain region 23b of the second conductivity type (n-type), respectively. Each of the first floating drain region 23a and the second floating drain region 23b is the semiconductor region having a higher impurity concentration than the surface buried region 22. As evident from FIG. 3, the surface buried region 22 is formed to contact with the first floating drain region 23a and the second floating drain region 23b in the right and left portions.

As shown in FIG. 3, a gate electrode of a signal-read-out transistor (amplification transistor) MA1 implementing the voltage-read-out buffer amplifier 82 is connected to the first floating drain region 23a, and a gate electrode of a signal-read-out transistor (amplification transistor) MA2 of the voltage-read-out buffer amplifier 82 is connected to the second floating drain region 23b. A source electrode of the signal-read-out transistor (amplification transistor) MA1 is connected to a power supply VDD, and a drain electrode is connected to a source electrode of a switching transistor MS1, which is adapted for selecting pixel. A drain electrode of the switching transistor MS1 adapted for selecting pixel is connected to a vertical signal line $B_{j2}$, and a control signal S for selecting a horizontal line is applied to the gate electrodes by the vertical shift register and vertical scanner 95. A source electrode of the signal-read-out transistor (amplification transistor) MA2 is connected to the power supply VDD, and a drain electrode is connected to a source electrode of a switching transistor MS2 adapted for selecting pixel. A drain electrode of the switching transistor MS2 adapted for selecting pixel is connected to a vertical signal line $B_{j1}$, and the control signal S for selecting the horizontal line is applied to the gate electrodes by the vertical shift register and vertical scanner 95. Since the selecting control signal S is set at high (H) level, the switching transistors MS1, MS2 are turned on, and the currents which are amplified by the signal-read-out transistors (amplification transistors) MA1, MA2 and correspond to the potentials of the first floating drain region 23a and the second floating drain region 23b flow through the vertical signal lines $B_{j2}$, $B_{j1}$.

Figure 4:
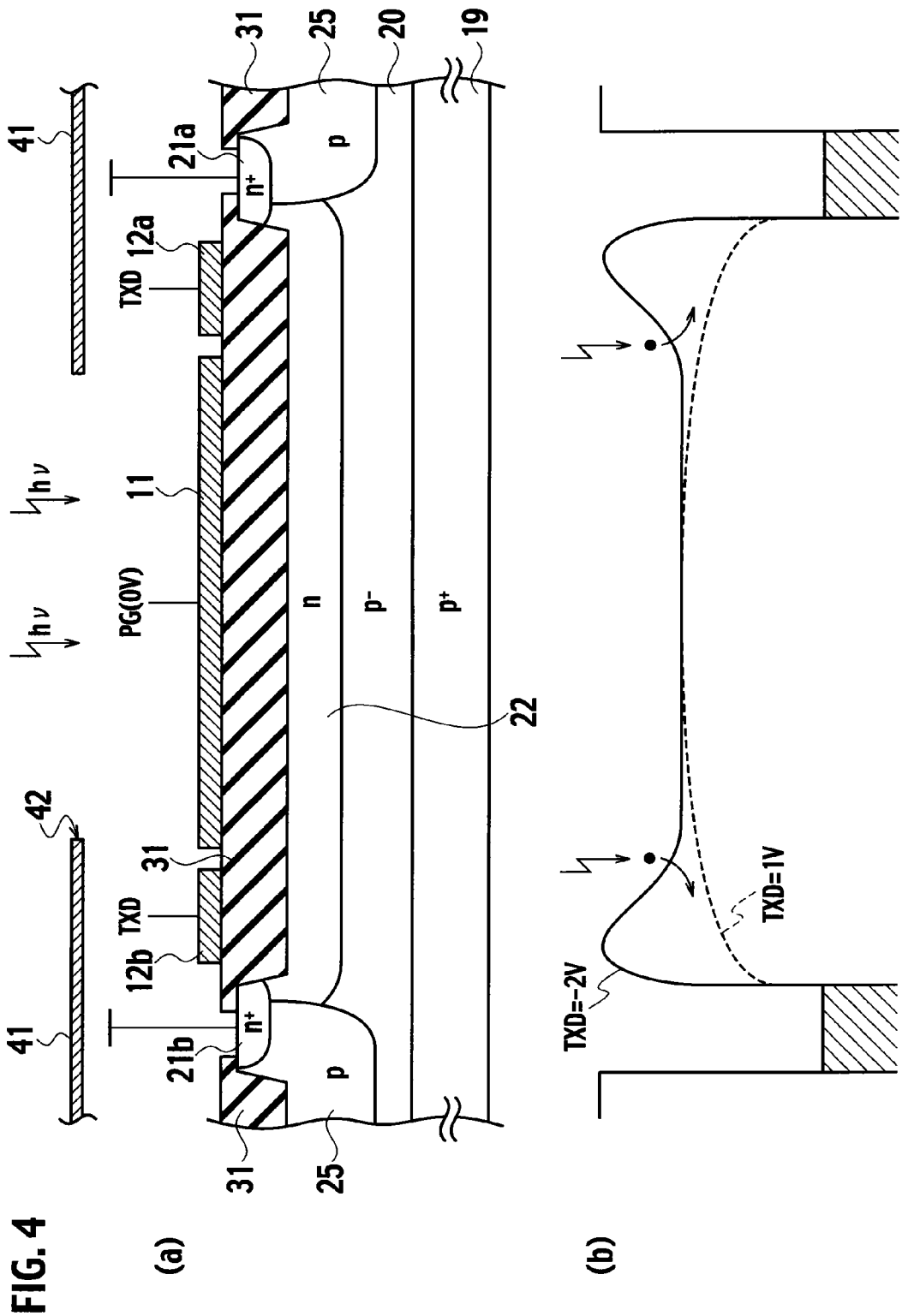
FIG. 4 is a diagrammatic cross-sectional view that is viewed from a B-B direction in FIG. 2.

FIG. 4 is a cross-sectional configuration viewed from the B-B direction of the semiconductor range-finding element, which has been shown in FIG. 2, and shows the semiconductor substrate 19 of the first conductivity type (p-type), and the semiconductor layer (epitaxial growth layer) 20 of the first conductivity type (p-type) arranged on the semiconductor substrate 19, and the surface buried region 22 of the second conductivity type (n-type) arranged on the semiconductor layer (epitaxial growth layer) 20. The semiconductor photoelectric conversion element is implemented by the insulating film 31 directly under the light-receiving gate electrode 11 in the central portion, the surface buried region 22, the semiconductor layer (epitaxial growth layer) 20 and the semiconductor substrate 19. A sub-area of the semiconductor layer (epitaxial growth layer) 20 of the first conductivity type (p-type) located directly under the light-receiving gate electrode 11 serves as the charge generation region of the semiconductor photoelectric conversion element. As already explained in FIG. 3, the carriers (electrons) generated in the charge generation region are injected into the sub-area of the surface buried region 22 directly over the charge generation region.

The insulating film 31 extends from directly under the light-receiving gate electrode 11 to under the first exhausting gate electrode 12a and the second exhausting gate electrode 12b in the right and left portions of FIG. 4 (corresponding to the upper and lower directions of FIG. 2). Below this insulating film 31, the surface buried region 22 is buried to extend from directly under the light-receiving gate electrode 11 to under the first exhausting gate electrode 12a and the second exhausting gate electrode 12b in the right and left directions. That is, in the surface buried region (another sub-area of the surface buried region 22) 22 adjacent to the right side of the surface buried region 22 directly under the light-receiving gate electrode 11 (directly over the charge generation region), the site located directly under the first exhausting gate electrode 12a serves as a first exhausting channel. On the other hand, in the surface buried region (a still another sub-area of the surface buried region 22) 22 adjacent to the left side of the surface buried region 22 directly under the light-receiving gate electrode 11 (directly over the charge generation region), the site located directly under the second exhausting gate electrode 12b serves as a second exhausting channel. Then, the first exhausting gate electrode 12a and the second exhausting gate electrode 12b electrostatically control the potentials of the first and second exhausting channels through the insulating films 31 formed on those first and second exhausting channels, respectively, and transfer the background charges through the first and second exhausting channels to the first floating drain region 23a and the second floating drain region 23b of the second conductivity type (n-type), respectively. Each of the first floating drain region 23a and the second floating drain region 23b is the semiconductor region of the higher impurity concentration than the surface buried region 22. As evident from FIG. 4, the surface buried region 22 is formed to contact with the first floating drain region 23a and the second floating drain region 23b in the right and left portions.

In the cross-sectional structure shown in FIG. 3 and FIG. 4, the impurity concentration of the semiconductor layer 20 serving as the charge generation region is lower than the impurity concentration of the semiconductor substrate 19. That is, the semiconductor substrate 19 is preferred to have the impurity concentration of about $4\times10^{17}$ cm$^{-3}$ or more and about $1\times10^{21}$ cm$^{-3}$ or less, and the semiconductor layer (epitaxial growth layer) 20 serving as the charge generation region is preferred to have the impurity concentration of about $6\times10^{11}$ cm$^{-3}$ or more and about $2\times10^{15}$ cm$^{-3}$ or less. In particular, when the semiconductor substrate 19 is a silicon substrate having the impurity concentration of about $4\times10^{17}$ cm$^{-3}$ or more and about $1\times10^{21}$ cm$^{-3}$ or less, and the semiconductor layer (epitaxial growth layer) 20 is elected to be a silicon epitaxial growth layer 20 having the impurity concentration of about $6\times10^{11}$ cm$^{-3}$ or more and about $2\times10^{15}$ cm$^{-3}$ or less, conventional CMOS process can be employed. From the viewpoint of industrial meaning, in the case of the semiconductor substrate 19 having the impurity concentration of about $8\times10^{17}$ cm$^{-3}$ or more and about $1\times10^{20}$ cm$^{-3}$ or less and the silicon epitaxial semiconductor layer 20 having the impurity concentration of about $6\times10^{13}$ cm$^{-3}$ or more and about $1.5\times10^{15}$ cm$^{-3}$ or less, the availability on the market is easy, and these device parameters are preferable. The thickness of the silicon epitaxial semiconductor layer 20 may be between about 4 and 20 μm and preferably between about 6 and 10 μm. The semiconductor layers (epitaxial growth layers) 20 located directly under the light-receiving gate electrode 11 and directly under the first transfer gate electrode 16a and the second transfer gate electrode 16b in the right and left portions are the regions in which the p-wells and n-wells, being essential in conventional CMOS process, are not provided. On the other hand, the surface buried region 22 can employ the value of the impurity concentration of about $5\times10^{14}$ cm$^{-3}$ or more and about $5\times10^{16}$ cm$^{-3}$ or less, typically, for example, the impurity concentration of about $1\times10^{15}$ cm$^{-3}$, and its thickness can be set between about 0.1 and 3 μm, preferably between about 0.5 and 1.5 μm.

FIG. 3 and FIG. 4 show the example of using the buried insulating film (buried oxide film) of a shallow trench isolation (STI) structure used in an element isolation architecture, which is adapted for miniaturized integrated circuits, as the insulating film 31. However, as the insulating film 31, it is possible to use different kinds of insulating films, such as a field oxide film grown by a selective oxidization method, which may be called "LOCOS (Local oxidation of silicon) method", used for the element isolation architecture, and the like.

When the insulating film 31 is made of thermally oxidized film, the thickness of the thermally oxidized film may be elected to be about 150 nm or more and about 1000 nm or less, and preferably elected to be about 200 nm or more and about 400 nm or less. When the insulating film 31 is made of dielectric film other than the thermally oxidized film, "an equivalent thickness" in terms of the dielectric constant $\in_r$ (at 1 MHz, $\in_r=3.8$) of the thermally oxidized film may be defined. For example, when the CVD oxide film having a dielectric constant $\in_r=4.4$ is used, the equivalent thickness may be employed that is 1.16 times (4.4/3.8) of the thickness of the thermally oxidized film, and when the silicon nitride ($Si_3N_4$) film having a dielectric constant $\in_r=7$ is used, the equivalent thickness may be employed that is 1.84 times (7/3.8) of the thickness of the thermally oxidized film. However, the oxide film ($SiO_2$ film) formed by the standard CMOS technique is preferred to be used, and the use of the field oxide film in the CMOS technique is suitable for the simplification of the manufacturing step.

Figure 5:
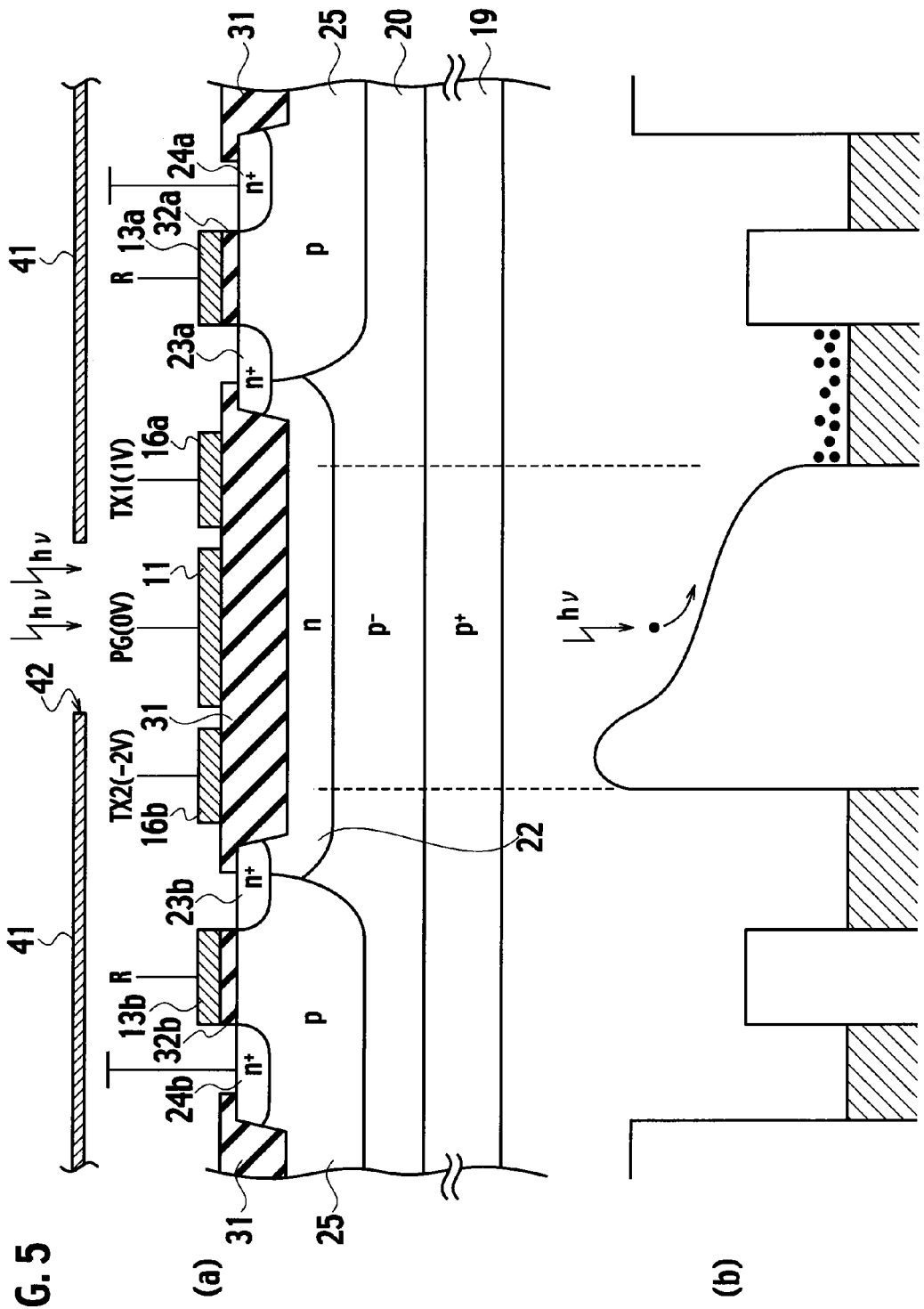
FIG. 5 is a diagrammatic view describing a potential distribution in a surface buried region when a control pulse signal TX1=1V is applied to a first transfer gate electrode and a control pulse signal TX2=−2V is applied to a second transfer gate electrode and a manner of a transfer of signal charges to a first floating drain region.
Figure 6:
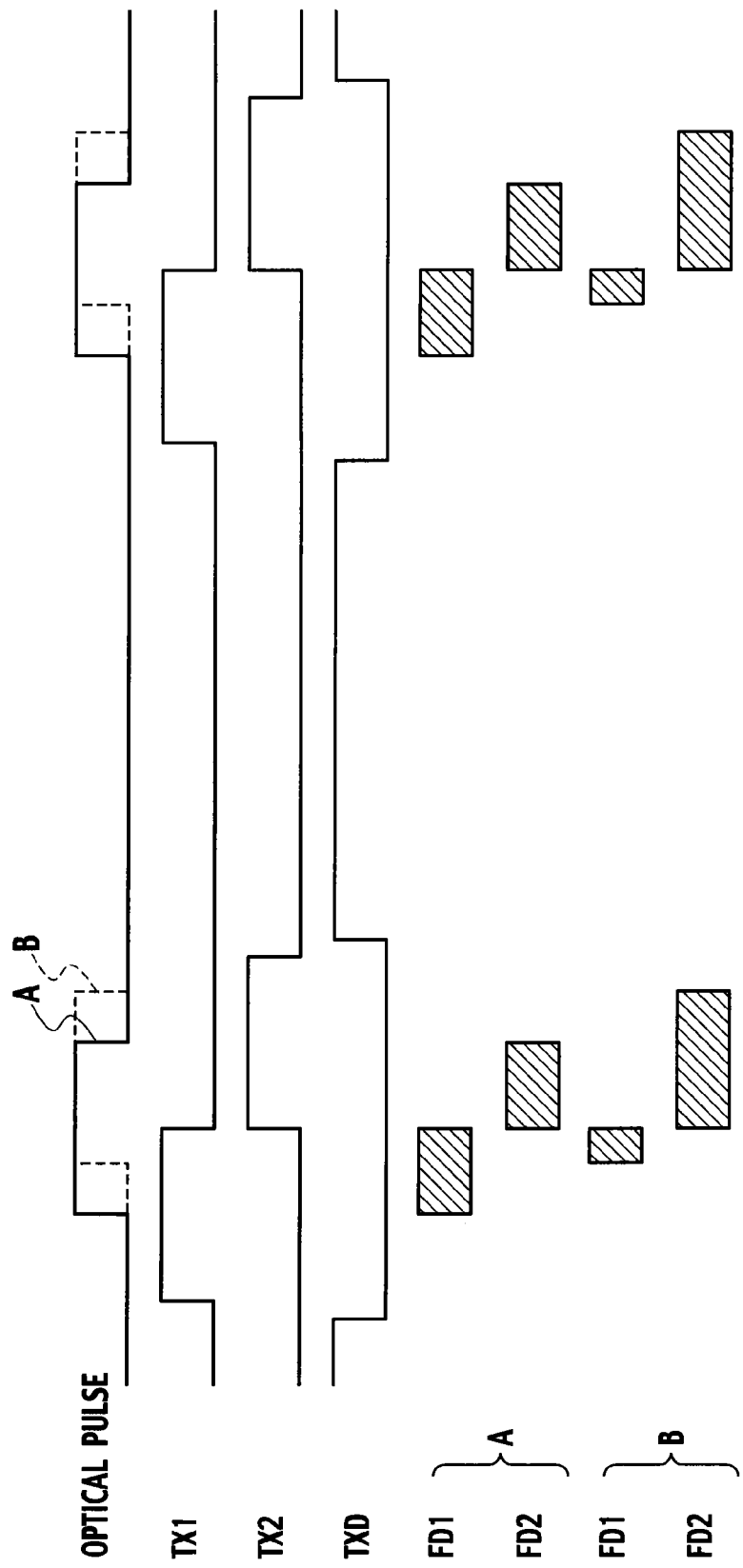
FIG. 6 is a timing chart describing a relation of an operational timing between optical pulses entered to a light-receiving gate electrode in the semiconductor range-finding element according to the first embodiment and the control pulse signals applied to the first transfer gate electrode and the second transfer gate electrode.

Control pulse signals as shown in FIG. 6 are applied to the first transfer gate electrode 16a and the second transfer gate electrode 16b formed on the insulating film (field oxide film) 31. A constant voltage, for example, 0 V is applied to the central light-receiving gate electrode 11. For example, when a control pulse signal TX1=1V is applied to the first transfer gate electrode 16a and a control pulse signal TX2=−2V is applied to the second transfer gate electrode 16b, the potential distribution in the surface buried region 22 is as shown in FIG. 5. Then, the electrons generated by the light are transferred to the first floating drain region 23a on the right side. Reversely, when the control pulse signal TX1=−2V is applied to the first transfer gate electrode 16a and the control pulse signal TX2=1V is applied to the second transfer gate electrode 16b, the electrons generated by the light are transferred to the second floating drain region 23b on the left side.

This charge transfer is carried out at a high speed. For example, while the optical pulses as shown in FIG. 6 are emitted, the charges caused by an optical pulse irradiated in the period when the control pulse signal TX1=1V are transferred to the first floating drain region 23a on the right side, and the charges caused by an optical pulse irradiated in the period when the control pulse signal TX2=1V are transferred to the second floating drain region 23b on the left side. In FIG. 6, when an optical pulse having the waveform indicated by A is illuminated, the quantities of the electrons transferred to the first floating drain region 23a and the second floating drain region 23b are equal, and when an delayed optical pulse such as the waveform indicated by B is illuminated, the quantity of the electrons transferred to the second floating drain region 23b on the left side is increased. Thus, when those processes are repeated and the difference between the quantities of the electrons accumulated in the first floating drain region 23a on the right side and the second floating drain region 23b on the left side is determined, the time lag between the optical pulses can be estimated. When the signal charges that are transferred to and accumulated in the second floating drain region 23b on the left side are assumed to be $Q_1$ and the signal charges that are transferred to and accumulated in the first floating drain region 23a on the right side are assumed to be $Q_2$, an estimated range L is given by the following equation.

$$L = (cT_0/2)(Q_2/(Q_1+Q_2)) \qquad (1)$$

Here, c is the light speed, and To is the width of the optical pulse.

In the first embodiment of the present invention, in addition to the structures to transfer such signal charges $Q_1$, $Q_2$, in order to remove the influence of the background light, the first exhausting gate electrode 12a and the second exhausting gate electrode 12b are provided in the upper and lower directions in the plan view of FIG. 2. That is, the background charges are exhausted through the first exhausting gate electrode 12a and the second exhausting gate electrode 12b to the first exhausting drain region 21a and the second exhausting drain region 21b, which serve as the exhausting outlets. Control pulse signals TXD are applied to the first exhausting gate electrode 12a and the second exhausting gate electrode 12b on the upper and lower portions. Then, as shown in the timing chart of FIG. 6, the pulse widths of the control pulse signals TXD that are applied to the first exhausting gate electrode 12a and the second exhausting gate electrode 12b are made longer than the pulse widths of the control pulse signals TX1, TX2 that are applied to the first transfer gate electrode 16a and the second transfer gate electrode 16b. That is, in the period while the optical pulse is not irradiated, the potential of the control pulse signal TXD is made high, and the background charges generated by the background light are exhausted to the first exhausting drain region 21a and the second exhausting drain region 21b.

FIG. 4 shows the operation of exhausting the background charges. When the control pulse signal TX1 is applied to the first transfer gate electrode 16a and the control pulse signal TX2 is applied to the second transfer gate electrode 16b so that the signal charges are divided into the right and left portions, a negative voltage (for example, TXD=-2 V) is applied to the first exhausting gate electrode 12a and the second exhausting gate electrode 12b, and a potential barrier is generated as indicated by a solid line in FIG. 4 so that the charges are not transferred to the first exhausting drain region 21a and the second exhausting drain region 21b.

On the other hand, when the background charges are required to be exhausted, as indicated by a broken line in FIG. 4, a high potential (for example, 1 V) is applied to the first exhausting gate electrode 12a and the second exhausting gate electrode 12b so that the transfer of the background charges to the first exhausting drain region 21a and the second exhausting drain region 21b is made easy.

By the way, the applying method of the voltage shown in FIG. 4 is intended for the exemplification. The voltages TXD, which are applied to the first exhausting gate electrode 12a and the second exhausting gate electrode 12b on the right and left sides in FIG. 4, are not especially required to be equal, and background charges can be exhausted even when the +voltage is alternately added. Also, as shown in FIG. 4, even when the same positive voltage is applied, the background charges can be exhausted. That is, the flexible applying methodologies of various voltages can be performed on the voltages TXD that are applied to the first exhausting gate electrode 12a and the second exhausting gate electrode 12b on the right and left sides in FIG. 4. Thus, applying the various voltages can effectively remove the influence of the background charges.

As mentioned above, according to the semiconductor range-finding element of the first embodiment, the predetermined voltage is applied to the first exhausting gate electrode 12a and the second exhausting gate electrode 12b, and the background charges are transferred to the first exhausting drain region 21a and the second exhausting drain region 21b. Thus, the influence of the background light can be suppressed. If the background light is included in the signal, because of the existence of the shot noise in the light, when there are the background charges, the shot noise leads to the drop in a range measurement precision. However, according to the semiconductor range-finding element of the first embodiment, the background charges can be effectively removed, thereby achieving a high range measurement precision (distance resolution) and the maximum range measurement coverage.

Moreover, it is possible to protect the background charges from being accumulated in the first floating drain region 23a and the second floating drain region 23b, and it is possible to maximally use the capacities of the first floating drain region 23a and the second floating drain region 23b and accumulate the signal charges. Thus, it is possible to attain the wide dynamic range. Moreover, when the dynamic range is represented by the maximal value for the signal and the noise level, the noise caused by the background charges is decreased, thereby increasing the dynamic range.

<Operation of Solid-State Imaging Device>

The operations of the solid-state imaging device (two-dimensional image sensor) according to the first embodiment of the present invention, whose schematic configuration is shown in FIG. 1, will be described below with reference to the timing chart in FIG. 7.

(a) To all of the first reset gate electrode 13a and the second reset gate electrode 13b in each of all the pixels $X_{11}$ to $X_{1m}$, $X_{21}$ to $X_{2m}$, - - - , $X_{n1}$ to $X_{nm}$ shown in FIG. 1, control signals R at high (H) level are applied, and the charges accumulated in the first floating drain region 23a and the second floating drain region 23b are discharged to the first reset source region 24a and the second reset source region 24b, respectively, and the first floating drain region 23a and the second floating drain region 23b are reset.

(b) After that, the optical pulse is emitted from the light source 91, and the optical pulse reflected by the target sample 92 enters through the opening 42 of the light shielding film 41 in each of the pixels $X_{11}$ to $X_{1m}$, $X_{21}$ to $X_{2m}$, - - - , $X_{n1}$ to $X_{nm}$ to each of the semiconductor photoelectric conversion elements. In synchronization with this, the repetitive pulses TX1, TX2 are applied to the first transfer gate electrode 16a and the second transfer gate electrode 16b in each of all the pixels $X_{11}$ to $X_{1m}$, $X_{21}$ to $X_{2m}$, - - - , $X_{n1}$ to $X_{nm}$ at the timing as shown in FIG. 7, all at once, and the first transfer gate electrode 16a and the second transfer gate electrode 16b are driven for a predetermined constant period.

(c) After that, the emission of the optical pulse from the light source 91 is stopped, and the voltages of the first floating drain region 23a and the second floating drain region 23b are read out to the outside by using the voltage-read-out buffer amplifier 82. In this read-out period, so that the charges generated by the background light signal do not flow in the first floating drain region 23a and the second floating drain region 23b, negative voltages are applied to the first transfer gate electrode 16a and the second transfer gate electrode 16b, and positive high voltages are applied to the first exhausting gate electrode 12a and the second exhausting gate electrode 12b.

(d) As for the reading out, the voltages of the first floating drain region 23a and the second floating drain region 23b are read out to the noise processing circuits $NC_1$ to $NC_m$ of the corresponding column, and in each of the noise processing circuits $NC_1$ to $NC_m$, noise canceling are carried out by a noise canceller 83 and a noise canceller 84, and a horizontal scanning is then executed. The selection of one horizontal line is carried out by applying the control signal S to the switching transistors MS1, MS2, adapted for selecting pixel, in the voltage-read-out buffer amplifiers 82 inside the pixels $X_{11}$ to $X_{1m}$, $X_{21}$ to $X_{2m}$, - - - , $X_{n1}$ to $X_{nm}$. Then, the signal of each of the horizontal lines corresponding to a vertical signal appears. In order to decrease the fixed pattern noise and 1/f noise which are generated by the voltage-read-out buffer amplifier 82 in each of the pixels $X_{11}$ to $X_{1m}$, $X_{21}$ to $X_{2m}$, - - - , $X_{n1}$ to $X_{nm}$, the noise canceller 83 and the noise canceller 84 determine the difference between signal level and the level when the first floating drain region 23a and the second floating drain region 23b are reset. The noise canceller 83 and the noise canceller 84 are the circuits for sampling the signal level with φS and the level after the reset with φR, and determining the difference between the signal level and the reset level. Since the noise canceller itself is not much related to the essential feature of the present invention, the explanation of the noise canceller is omitted.

As explained above, according to the solid-state imaging device of the first embodiment, in each of the pixels, the predetermined voltage is applied to the first exhausting gate electrode 12a and the second exhausting gate electrode 12b, and the background charges are transferred to the first exhausting drain region 21a and the second exhausting drain region 21b, and the influence of the background light can be suppressed, which can suppress the shot noise caused by the background charges and can consequently attain the high range measurement precision (distance resolution) and the maximum range measurement coverage.

Moreover, according to the solid-state imaging device of the first embodiment, in each of the pixels, it is possible to protect the background charges from being accumulated in the first floating drain region 23a and the second floating drain region 23b, and it is possible to maximally use the capacities of the first floating drain region 23a and the second floating drain region 23b and accumulate the signal charges. Thus, it is possible to attain the wide dynamic range. Moreover, when the dynamic range is represented by the maximal value for the signal and the noise level, the noise caused by the background charges is decreased, thereby increasing the dynamic range.

<Manufacturing Method of Semiconductor Range-Finding Element and Solid-State Imaging Device>

Figure 9:
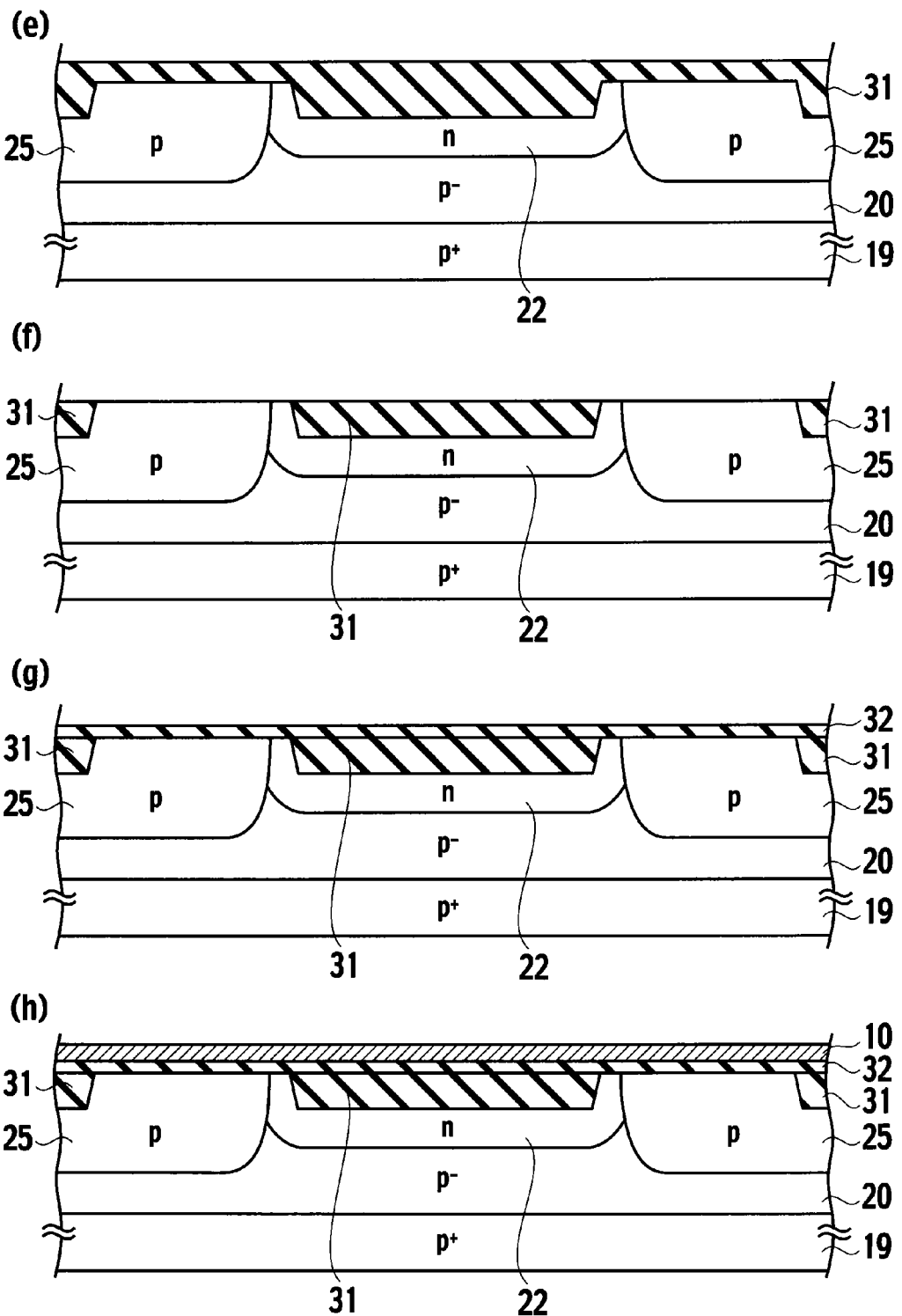
FIG. 9 is a process-flow cross-sectional view (No. 2) describing the manufacturing method of the semiconductor range-finding element and solid-state imaging device, according to the first embodiment of the present invention.

The manufacturing method of the semiconductor range-finding element and solid-state imaging device according to the first embodiment of the present invention will be described below with reference to FIG. 8 to FIG. 10. By the way, the manufacturing method of the semiconductor range-finding element and solid-state imaging device, which will be described below, is one example. It is natural that the various manufacturing methods other than the method described below, including the variation of the method described below can manufacture the semiconductor range-finding element and solid-state imaging device.

(a) At first, as shown in FIG. 8(a), an epitaxial substrate encompassing a p-type semiconductor substrate 19, whose main surface is a (100) plane, of about 0.07 to 0.0012 Ωcm (an impurity concentration is about $8 \times 10^{17}$ cm$^{-3}$ or more and about $1 \times 10^{20}$ cm$^{-3}$ or less) and a p-type silicon epitaxial growth layer 20 grown on the semiconductor substrate 19, the epitaxial growth layer 20 having a thickness of about 4 to 20 μm and an impurity concentration of about $6 \times 10^{13}$ to $1.5 \times 10^{15}$ cm-3 or less is prepared. After the thermally oxidized film (SiO$_2$) of about 150 nm is formed on the main surface of the p-type silicon epitaxial growth layer 20, a photo resist film is coated, and the photo resist film is delineated by a photolithography technique, and a p-well formation region is opened in the photo resist film. Next, boron ions ($^{11}$B$^+$) of a dose amount of about $10^{12}$ to $10^{13}$ cm$^{-2}$ are implanted through the thermally oxidized film into the p-well formation region. Next, the portion of the well formation region of the thermally oxidized film is etched and removed. Also, the photo resist film is removed, and after the completion of a predetermined cleaning step, the implanted boron ions are thermally diffused at about 1200° C., and a p-well 25 is formed as shown in FIG. 8(b). Although the illustration is omitted, the p-well 25 to form the first exhausting drain region 21a and the second exhausting drain region 21b shown in FIG. 4 are also formed respectively which are respectively allocated at near side and rear side of the paper, on which FIG. 8(b) is illustrated. Moreover, although the illustration is omitted, another p-wells 25 are formed in the peripheral circuit area and the read-out buffer amplifier 82 assigned in each of the unit pixel $X_{ij}$ at the same time. Also, n-wells are similarly formed in the peripheral circuit area whose illustration is omitted.

(b) Next, after the thermally oxidized film on the main surface of the p-type silicon epitaxial growth layer 20 is removed and stripped all over the surface, a pad oxide film (SiO$_2$) 51 having a film thickness of about 100 nm is again formed on the main surface of the silicon epitaxial growth layer 20, by means of a thermally oxidizing method. After the thermal oxidation, the CVD method is used to grow a nitride film (Si$_3$N$_4$) 52 having a film thickness of about 200 nm. A photo resist film 53, which has been delineated by the photolithography technique, is prepared on the nitride film 52. Then, with the delineated photo resist film 53 as a mask, reactive ion etching (RIE) is executed. Then, as shown in FIG. 8(c), phosphorous ions ($^{31}$P$^+$) of a dose amount of about $6 \times 10^{13}$ to $3 \times 10^{11}$ cm$^{-2}$ are implanted into the p-type silicon epitaxial growth layer 20. Then, an ion implanted layer 54 scheduled for the surface buried region is formed on the surface of the p-type silicon epitaxial growth layer 20. On the other hand, although the illustration is omitted, in the peripheral circuit and the read-out buffer amplifiers 82 arranged in each of the unit pixels $X_{ij}$, with the nitride film 52 serving as the mask for channel-stop ion-implantation, the inversion protection impurity ions are implanted so as to generate an inversion protection layer in the element isolation region.

Therefore, when the inversion protection impurity ions are implanted into the element isolation region, it is necessary that the inversion protection impurity ions do not enter the ion implanted layer 54 scheduled for the surface buried region shown in FIG. 8(c). Therefore, after the removal of the photo resist film 53, the opening of the nitride film 52 on the upper portion of the ion implanted layer 54 scheduled for the surface buried region shown in FIG. 8(c) is covered with a different photo resist film by the photolithography technique, and the phosphorous ions ($^{31}P^+$) of a dose amount of about $6\times10^{14}$ to $2\times10^{15}$ cm$^{-2}$ are channel-stop-ion-implanted into only the nMOS formation regions of the peripheral circuit and the read-out buffer amplifier 82. Next, after the removal of the photo resist film, the photolithography technique is used to delineate a new photo resist film, and the boron ions ($^{11}B^+$) are channel-stop-ion-implanted into only the pMOS formation region of the peripheral circuit.

(c) After that, after the removal of the photo resist film and the completion of the predetermined cleaning step, a annealing process between about 1100° C. and 1150° C. is executed to thermally diffuse the implanted phosphorous ions ($^{31}P^+$), and the surface buried region 22 is formed as shown in FIG. 8(d). Simultaneously, a p$^+$ inversion protection layer (channel-stop-region) is formed in the element isolation region surrounding the pMOS formation region in the peripheral circuit, and n$^+$ inversion protection layers (channel stop regions) are formed in the element isolation regions surrounding the nMOS formation regions in the peripheral circuit and the read-out buffer amplifier 82. However, those illustrations are omitted. (d) Next, the new thermally oxidized film (SiO$_2$) between about 250 nm and 500 nm is formed on the entire surface of the main surface of the p-type silicon epitaxial growth layer 20, including the surface of the p-well 25 and the surface of the surface buried region 22. Moreover, after that, the photo resist film is coated, and the photo resist film is delineated by the photolithography technique, and the etching mask (first etching mask) for element isolation trench formation is formed. With the photo resist film as the mask, the thermally oxidized film (SiO$_2$) is etched by the RIE. Then, the photo resist film is removed, and the etching mask (second etching mask) for the element isolation trench formation that is made of the thermally oxidized film (SiO$_2$) is formed. By using the etching mask for the element isolation trench formation that is made of this thermally oxidized film (SiO$_2$), on the surface of the surface buried region 22, the element isolation trench having a depth of about 150 nm or more and 1000 nm or less, preferably, about 200 nm or more and 700 nm or less, is formed by the RIE. Although the illustration is omitted, the element isolation trench is similarly formed in the element isolation regions in the peripheral circuit and the read-out buffer amplifier 82. Moreover, the CVD method is used to deposit the insulating film 31 on the entire surface so that the insulating film 31 becomes thicker by 50 to 100 nm than the depth of the element isolation trench, as shown in FIG. 9(e), and the element isolation trench is perfectly filled. Moreover, with a chemical mechanical polishing (CMP), the p-well 25 is polished until its surface exposed. Then, as shown in FIG. 9(f), the insulating film 31 is buried in the element isolation trench. Although the illustration is omitted, similarly in the element isolation regions in the peripheral circuit and the read-out buffer amplifier 82, the insulating film 31 is buried in the element isolation trench, and the insulating film 31 serves as the field oxidization film.

(e) Next, a dummy oxide film having a film thickness of about 10 nm is formed on the surface of the p-well 25. At this time, the dummy oxide film is formed in the element formation regions in the p-well/n-well of the peripheral circuit and the p-well of the read-out buffer amplifier 82. Next, a gate threshold voltage control ($V_{th}$ control) ion-implantation is executed. At first, with the photolithography technique, the p-well 25 in the peripheral circuit is covered with the photo resist film, and the impurity ions for the pMOS gate threshold voltage control are then implanted. Next, after the removal of the photo resist film, the pattern of the photo resist film is formed on the region except the p-well 25 by means of the photolithography technique. In succession, simultaneously with the p-well of the peripheral circuit and the p-well of the read-out buffer amplifier 82, the impurity ions for the nMOS gate threshold voltage control are implanted to the p-well 25. After that, the photo resist film is removed. Moreover, the dummy oxide film used as the protective film for the $V_{th}$ control ion-implantation is stripped.

(f) Next, as shown in FIG. 9(g), the surface of the p-well 25 is thermally oxidized to form a gate oxide film 32. Moreover, as shown in FIG. 9(h), on the entire surface on the gate oxide film 32, the CVD method is used to deposit a poly-silicon film 10 of about 200 to 400 nm. Then, a photo resist film 55 delineated by the photolithography technique is provided on the poly-silicon film 10. Then, with the delineated photo resist film 55 as the mask, as shown in FIG. 10(i), the poly-silicon film 10 is etched by the reactive ion etching (RIE) and the like. Then, the light-receiving gate electrode 11, the first transfer gate electrode 16a, the second transfer gate electrode 16b, the first reset gate electrode 13a and the second reset gate electrode 13b are cut. Although the illustration is omitted, the first exhausting gate electrode 12a and the second exhausting gate electrode 12b are cut which are respectively allocated at near side and rear side of the paper of FIG. 10(i) at the same time. After that, the photo resist film 55 is removed.

(g) Next, the source/drain regions are formed in the n-well of the peripheral circuit. At first, by using the photolithography technique, the p-well 25 shown in FIG. 10(j), the p-well of the peripheral circuit, the p-well of the read-out buffer amplifier 82, and the first reset gate electrode 13a and second reset gate electrode 13b thereon are covered with a new photo resist film. Then, with the poly-silicon gate electrode of the n-well as the mask, in self-alignment methodology, the boron ions ($^{11}B^+$) are implanted at an order of a dose amount $10^{15}$ cm$^{-2}$. At this time, the boron ions ($^{11}B^+$) is also ion-implanted into the poly-silicon gate electrode of the n-well. Next, after the removal of the photo resist film, by using the photolithography technique, a different photo resist film is covered on the region except the p-well 25. Then, as shown in FIG. 10(j), with the first reset gate electrode 13a and the second reset gate electrode 13b as the mask, by self-alignment methodology, arsenic ions ($^{75}As^+$) are implanted at an order of $10^{15}$ cm-2 into the p-well 25. Simultaneously, arsenic ions ($^{75}As^+$) are similarly implanted, by self-alignment methodology, into the p-well of the peripheral circuit and the p-well of the read-out buffer amplifier 82, with the poly-silicon gate electrode as the mask. At this time, the arsenic ions ($^{75}As^+$) are implanted into the first reset gate electrode 13a and the second reset gate electrode 13b and the poly-silicon gate electrode on the p-well of the peripheral circuit whose illustration is omitted. Although the illustration is omitted, the arsenic ions ($^{75}As^+$) are implanted into the first exhausting gate electrode 12a and the second exhausting gate electrode 12b, which are respectively allocated at near side and rear side of the paper of FIG. 10(i). After that, the photo resist film is removed.

(h) Next, the p-type semiconductor substrate 19 is thermally processed. Since the p-type semiconductor substrate 19 is thermally processed, the impurities are diffused, and the p-type source/drain regions are formed in the n-well of the peripheral circuit whose illustration is omitted, and the first floating drain region 23a, the second floating drain region 23b, the first reset source region 24a and the second reset source region 24b are formed in the p-well 25 shown in FIG. 10(k). Although the illustration is omitted, the first exhausting drain region 21a and the second exhausting drain region 21b are formed even in the p-wells 25, which are respectively allocated at near side and rear side of the paper of FIG. 10(k). Similarly, the n-type source/drain regions are formed in the p-well of the peripheral circuit whose illustration is omitted, and the like. At this time, the arsenic ions ($^{75}As^+$) are implanted even into the first reset gate electrode 13a, the second reset gate electrode 13b, the first exhausting gate electrode 12a and the second exhausting gate electrode 12b. Since the implanted arsenic ions ($^{75}As^+$) are also activated, the resistances of the first reset gate electrode 13a and second reset gate electrode 13b are decreased. The resistance of the gate electrode of the n-well of the peripheral circuit whose illustration is omitted is similarly decreased.

(i) Next, although the illustration is omitted, inter-layer insulating films are deposited in order to insulate between the vertical signal line and horizontal scanning line to connect the respective pixels, or the metallic wiring layer for the connection between the respective transistors in the peripheral circuit and the portion between the poly-silicon films implementing the gate electrode. As the inter-layer insulating film, it is possible to use the various dielectric films, such as the composite film implemented by the double-layer structure of the oxide film ($CVD-SiO_2$) that is deposited by the CVD method and has a film thickness of about 0.5 µm; and the PSG film or BPSG film that is deposited on the oxide film ($CVD-SiO_2$) by means of the CVD method and has a film thickness of about 0.5 µm. After the deposition by means of the CVD method, the PSG film or BPSG film is thermally processed. Thus, the BPSG film in the upper layer of the composite film is reflowed, and the surface of the inter-layer insulating film is made flat. On the surface, the photo resist film delineated by the photolithography technique is used as the mask, and the inter-layer insulating film is etched by the RIE or ECR ion-etching and the like, and a contact hole to connect the metallic wiring layer and the transistor is formed. After that, the photo resist film used to form the contact hole is removed. Next, a sputtering method or electron beam vacuum evaporation method or the like is used to form the aluminum alloy film (Al—Si, Al—Cu—Si) including silicon and the like. Thereon, the photolithography technique is used to delineate a mask by the photo resist film, and by using the delineated photo resist film as a mask, the aluminum alloy film is delineated by the RIE. Such sequential processes are sequentially repeated. Consequently, the vertical signal line and horizontal scanning line to connect the respective pixels, or the metallic wiring layers to connect between the respective transistors in the peripheral circuit are formed. Moreover, a different inter-layer insulating film is formed on the metallic wiring layer, and the photolithography technique is used to form the metallic film having the opening 42 directly over the light-receiving gate electrode 11 of each pixel, and the metallic film serves as the light shielding film 41. Then, when the passivation film having a film thickness of about 1 µm, which is intended to protect the mechanical damage and protect the immersion of the water and the impurities, is laminated on the light shielding film 41 by means of the CVD method, the solid-state imaging device according to the first embodiment of the present invention is completed. The PSG film, the nitride film and the like are used in the passivation film.

As mentioned above, according to the manufacturing method of the semiconductor range-finding element and solid-state imaging device according to the first embodiment of the present invention, the first exhausting gate electrode 12a, the second exhausting gate electrode 12b, the first exhausting drain region 21a and the second exhausting drain region 21b, and the like can be manufactured only by changing the pattern of the element isolation region and the pattern of the gate electrode, in the manufacturing procedure of the standard CMOS image sensor, without any additionally step. Also, the formation of the surface buried region 22 may be attained by forming the surface buried region 22, through the ion-implantation and the like, as an extra step to the manufacturing procedure of the standard CMOS image sensor. Thus, the semiconductor range-finding element and solid-state imaging device of the first embodiment can be manufactured by adding the simple step. In this way, according to the manufacturing method of the semiconductor range-finding element and solid-state imaging device according to the first embodiment of the present invention, although the standard CMOS process is basic, it is possible to easily manufacture the structure, which is implemented by the first exhausting gate electrode 12a, the second exhausting gate electrode 12b, the first exhausting drain region 21a and the second exhausting drain region 21b at the same time and can effectively remove the backlight charges caused by the background light. Also, only by adding the step of forming the n-type surface buried region 22 serving as the transfer channel, the TOF range-finding sensor enabling the high speed signal transfer similarly to CCD can be manufactured by the standard CMOS process.

Modification of First Embodiment

Figure 11:
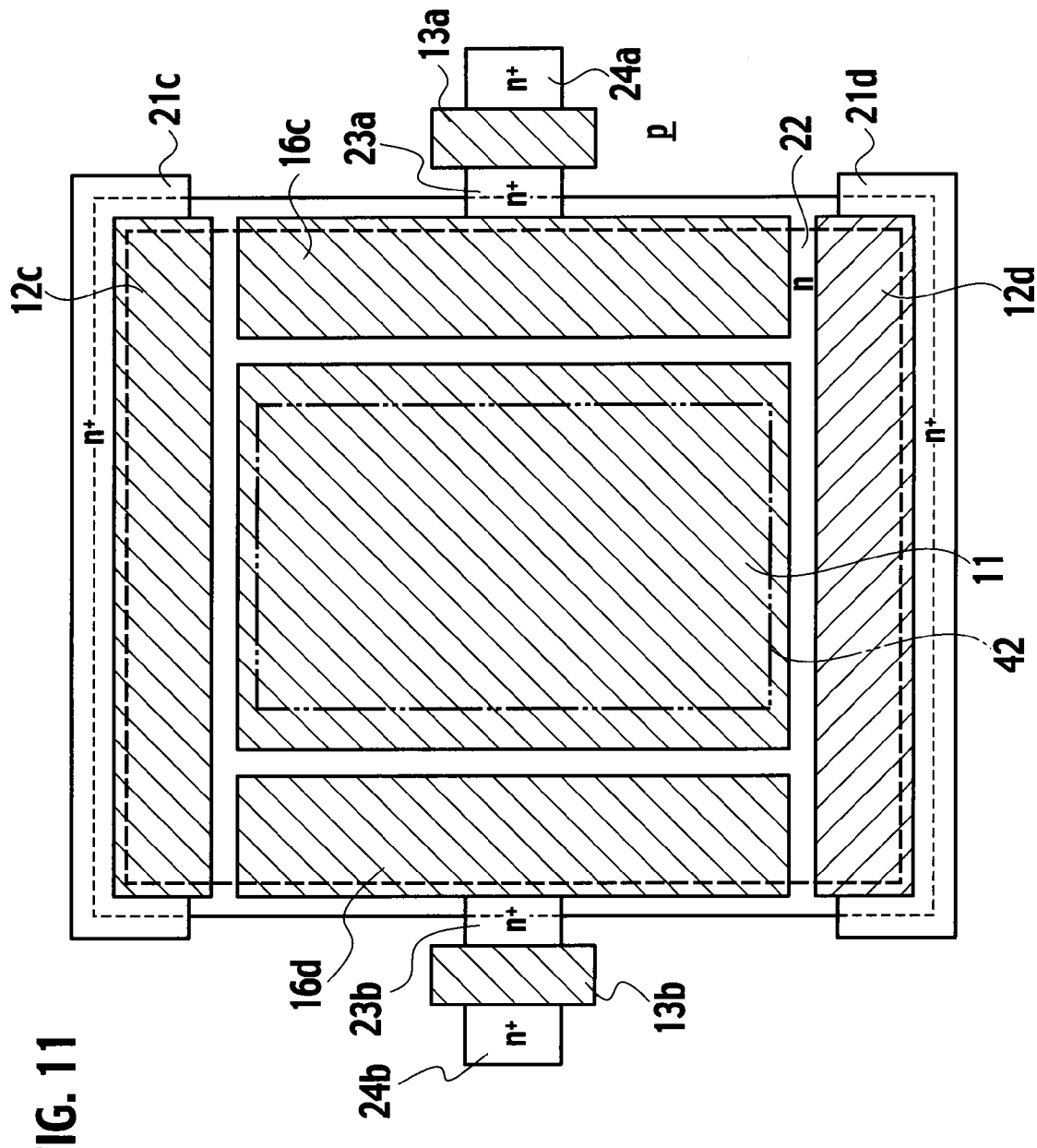
FIG. 11 is a schematic plan view describing a configuration of a semiconductor range-finding element serving as a part of pixels in a solid-state imaging device according to a variation in the first embodiment of the present invention.

As shown in FIG. 2, in the semiconductor range-finding element according to the first embodiment, on the planar pattern, the respective central lines (whose illustrations are omitted) of the first transfer gate electrode 16a and the second transfer gate electrode 16b are aligned on the same straight line A-A in the horizontal direction (right and left direction) in FIG. 2, and the respective widths of the first transfer gate electrode 16a and the second transfer gate electrode 16b that are measured in the direction (the upper and lower direction in FIG. 2) orthogonal to the transfer direction of the signal charges are made narrower than the width of the light-receiving gate electrode 11 measured in the orthogonal direction. This structure is advantageous in that, even if the area of the light-receiving region directly under the light-receiving gate electrode 11 is increased, the perfect transfer of the signal charges through the first transfer gate electrode 16a and the second transfer gate electrode 16b can be attained. However, this is not limited to the planar configuration shown in FIG. 2. For example, such as the semiconductor range-finding element according to a modification of the first embodiment shown in FIG. 11, the topology in which the respective widths of the first transfer gate electrode 16a and the second transfer gate electrode 16b that are measured in the direction (the upper and lower direction in FIG. 11) orthogonal to the transfer direction of the signal charges and the width of the light-receiving gate electrode 11 measured in this orthogonal direction are equal is possible although there is the difficulty with regard to the perfect transfer of the signal charges through the first transfer gate electrode 16a and the second transfer gate electrode 16b. In the planar configuration shown in FIG. 11, the rectangular first exhausting gate electrode 12a and second exhausting gate electrode 12b are oppositely arranged along the direction orthogonal to the transfer direction of the signal charges. Even if such rectangular first exhausting gate electrode 12a and second exhausting gate electrode 12b are employed, the first exhausting gate electrode 12a serves so as to exhaust the background charges that are generated in the charge generation region by the background light to the upper direction in FIG. 11, and the second exhausting gate electrode 12b serves so as to exhaust the background charges that are generated in the charge generation region by the background light to the lower direction in FIG. 11. Thus, it is possible to suppress the influence of the background light.

In this way, even in the semiconductor range-finding element according to the modification of the first embodiment, similarly to the semiconductor range-finding element according to the modification of the first embodiment, the predetermined voltage is applied to the first exhausting gate electrode 12a and the second exhausting gate electrode 12b, and the background charges are consequently transferred to the first exhausting drain region 21a and the second exhausting drain region 21b. Thus, since the influence of the background light can be suppressed, the shot noise caused by the background charges can be suppressed, thereby achieving a high range measurement precision (distance resolution) and the maximum range measurement coverage.

Moreover, according to the semiconductor range-finding element according to the modification of the first embodiment, it is possible to protect the background charges from being accumulated in the first floating drain region 23a and the second floating drain region 23b, and it is possible to maximally use the capacities of the first floating drain region 23a and the second floating drain region 23b and accumulate the signal charges. Thus, it is possible to attain the wide dynamic range. Moreover, when the dynamic range is represented by the maximal value for the signal and the noise level, the noise caused by the background charges is decreased, thereby increasing the dynamic range.

Second Embodiment

The entire configuration of a solid-state imaging device (two-dimensional image sensor) according to the second embodiment of the present invention is equivalent to the block diagram shown in FIG. 1. Thus, the overlapping or redundant description is omitted. However, the structure of the semiconductor range-finding element, which has the planar configuration shown in FIG. 12 and serves as the TOF pixel circuit 81 assigned in each of the pixels $X_{11}$ to $X_{1m}$, $X_{21}$ to $X_{2m}$, - - -, $X_{n1}$ to $X_{nm}$ in the solid-state imaging device according to the second embodiment, differs from the planar configuration of the semiconductor range-finding element according to the first embodiment.

Figure 12:
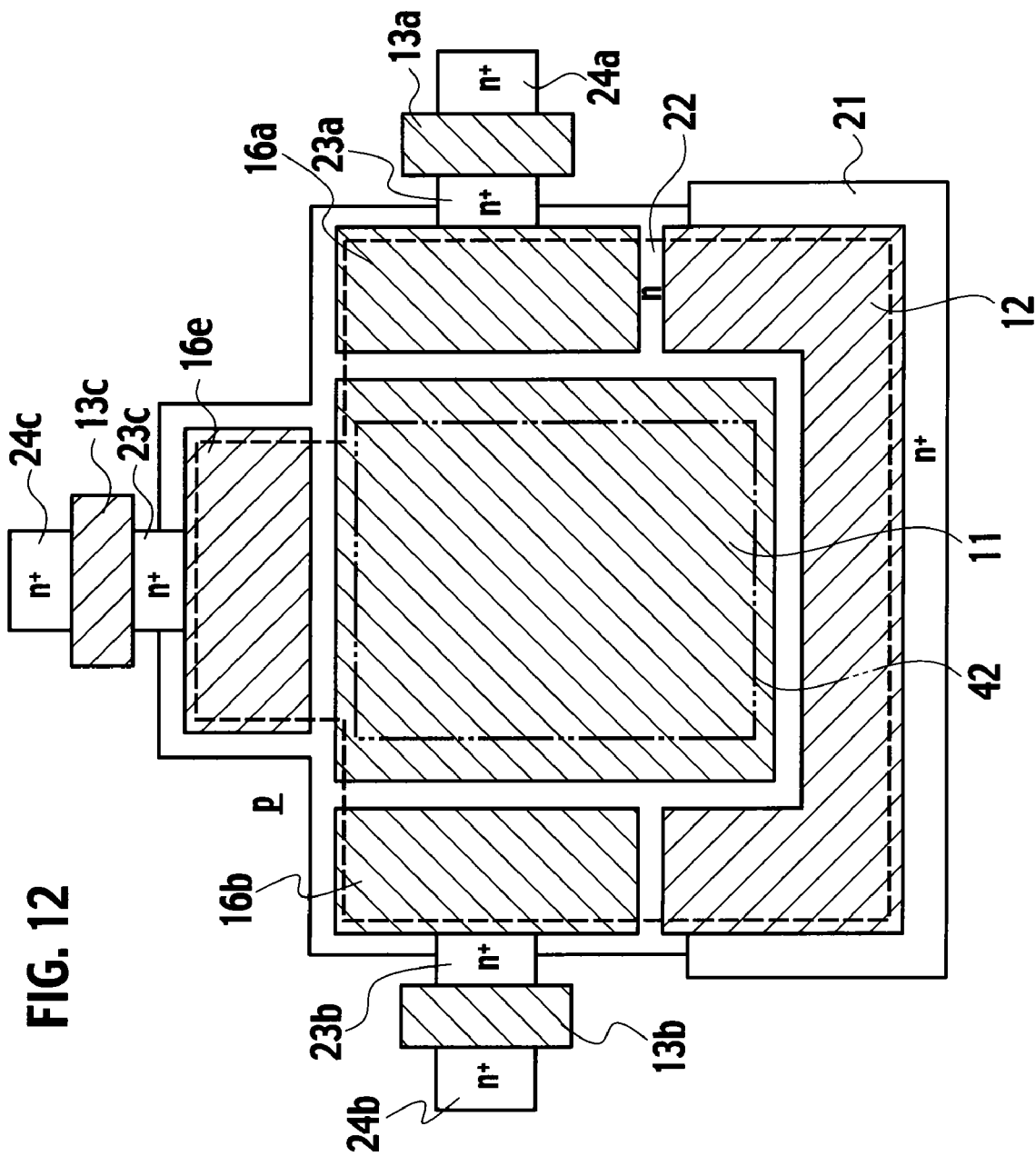
FIG. 12 is a schematic plan view describing a configuration of a semiconductor range-finding element serving as a part of pixels in a solid-state imaging device according to a second embodiment of the present invention.

That is, the semiconductor range-finding element according to the second embodiment of the present invention has the function for reading even the component, which is caused by the background light, out to the external and canceling the background light component. Therefore, as shown in FIG. 12, a first floating drain region 23a for accumulating the signal charges transferred by a first transfer gate electrode 16a is arranged on the right side, and a second floating drain region 23b for accumulating the signal charges transferred by a second transfer gate electrode 16b is arranged on the left side. A first reset gate electrode 13a adjacent to the first floating drain region 23a, and a first reset source region 24a that is opposite to the first floating drain region 23a with respect to the first reset gate electrode 13a are further arranged on the right side in FIG. 12. On the other hand, a second reset gate electrode 13b adjacent to a second floating drain region 23b, and a second reset source region 24b that is opposite to the second floating drain region 23b with respect to the second reset gate electrode 13b are further arranged on the left side in FIG. 12.

As shown in FIG. 12, in the semiconductor range-finding element according to the second embodiment, in such a way that the signal charges generated by the semiconductor photoelectric conversion element are transferred to the directions to each other (to the right and left directions), on the planar pattern, the respective central lines (whose illustrations are omitted) of the first transfer gate electrode 16a and the second transfer gate electrode 16b are aligned on the same straight line in the horizontal direction (right and left direction) of FIG. 12. As evident from FIG. 12, the respective central lines of the first transfer gate electrode 16a and the second transfer gate electrode 16b do not coincide with the central line of the light-receiving gate electrode 11, and their central lines are located above the central line of the light-receiving gate electrode 11.

However, even in FIG. 12, the respective widths of the first transfer gate electrode 16a and the second transfer gate electrode 16b, which are measured in the direction orthogonal to the transfer direction of the signal charges (the upper and lower direction in FIG. 2) are made narrower than the width of the light-receiving gate electrode 11 that is measured in the orthogonal direction. Thus, the feature that, even if the area of the light-receiving region directly under the light-receiving gate electrode 11 is made large, the perfect transfers of the signal charges that are carried out by the first transfer gate electrode 16a and the second transfer gate electrode 16b can be executed is based on the same design scheme as the structure of the semiconductor range-finding element according to the first embodiment shown in the plan view in FIG. 2.

In FIG. 12, a third transfer gate electrode 16e is arranged along the direction orthogonal to the transfer direction of the signal charges, on the upper side of FIG. 12. That is, as shown in FIG. 12, on the planar pattern, the central line (whose illustration is omitted) of the third transfer gate electrode 16e is arranged on the straight line along the vertical direction (upper and lower direction) in FIG. 12. The third transfer gate electrode 16e electrostatically controls the potential of a third transfer channel composed of the surface buried region 22 that is the same semiconductor region as the charge generation region shown in FIG. 3 and FIG. 4, through the insulating film 31 formed on this third transfer channel, and transfers the background charges through the third transfer channel. The background charges transferred by the third transfer gate electrode 16e are accumulated in a third floating drain region 23c.

On the other hand, on the lower side in FIG. 12, an upwardly U-shaped exhausting gate electrode 12 is arranged along the direction orthogonal to the transfer direction of the signal charges and opposite to the pattern of the third transfer gate electrode 16e. The exhausting gate electrode 12 exhausts the background charges, which are generated in the charge generation region by the background light, to the lower direction in FIG. 12, as described in the semiconductor range-finding element according to the first embodiment. The background charges exhausted by the exhausting gate electrode 12 are received by the exhausting drain region 21 allocated at lower direction in FIG. 12.

Figure 13:
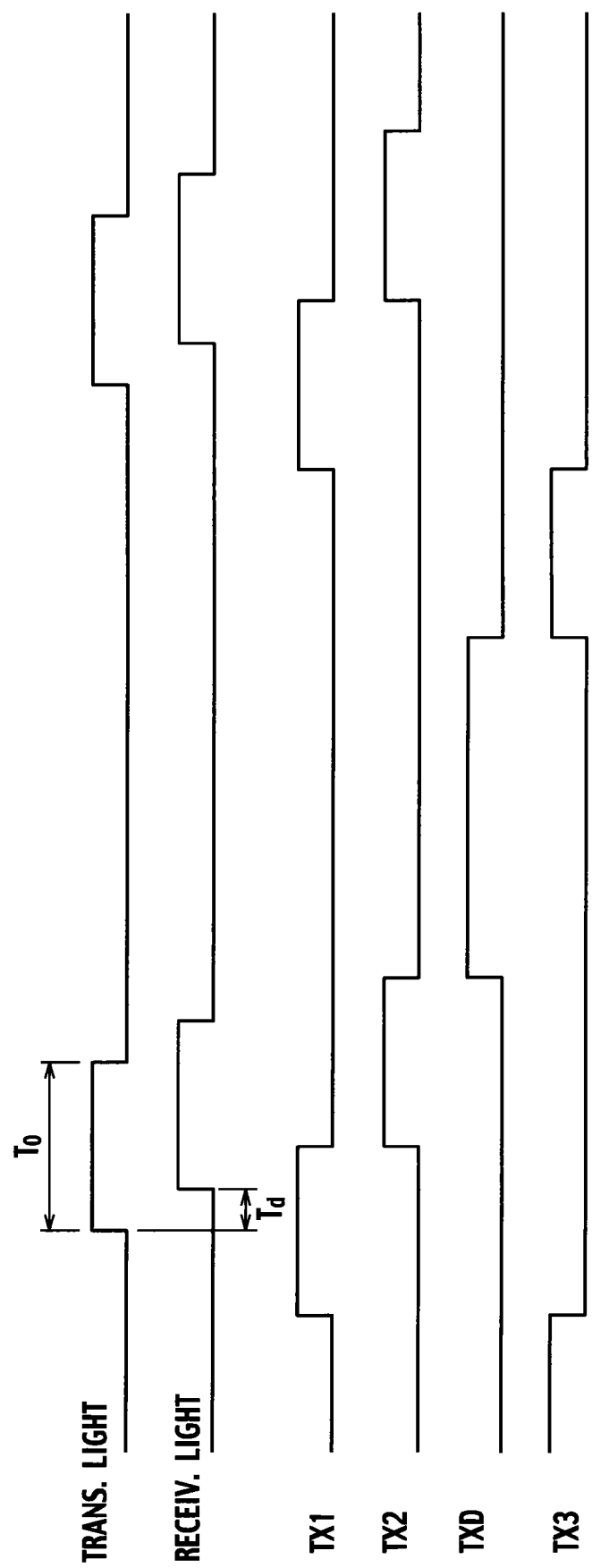
FIG. 13 is a timing chart describing a relation of an operational timing between an optical pulse entered to a light-receiving gate electrode in a semiconductor range-finding element according to the second embodiment and control pulse signals applied to a first transfer gate electrode, a second transfer gate electrode and a third transfer gate electrode.

A timing chart of the control pulse applied to the semiconductor range-finding element according to the second embodiment is as shown in FIG. 13. The signal charges resulting from the optical pulse signal generated under the light-receiving gate electrode 11 are transferred to the first floating drain region 23a and the second floating drain region 23b by the first transfer gate electrode 16a and the second transfer gate electrode 16b, respectively.

In the period when the optical pulse signal is not applied, the exhausting gate electrode 12 firstly exhausts the background charges resulting from the background light to the exhausting drain region 21. Next, at the same pulse width as the control pulse signal TX1 and control pulse signal TX2, a control pulse signal TX3 is applied to the third transfer gate electrode 16e, and the background charges are transferred to the third floating drain region 23c. Then, the voltage change caused by the background charges in the third floating drain region 23c, together with the first floating drain region 23a and the second floating drain region 23b, is read out to the outside. If when the first transfer gate electrode 16a and the second transfer gate electrode 16b capture the signal charges, the background light exists and the background charges included in the captured signal charge components has the same magnitude as the background charges captured by the third transfer gate electrode 16e, by subtracting the background charges, which are caused by the third transfer gate electrode 16e, from the signal charge components that are caused by the first transfer gate electrode 16a and the second transfer gate electrode 16b, it is possible to reduce the influence of the background light.

As mentioned above, according to the semiconductor range-finding element according to the second embodiment, it is possible to apply the predetermined voltage to the exhausting gate electrode 12 and transfer the background charges to the exhausting drain region 21 and also use the third transfer gate electrode 16e and then transfer the background charges to the third floating drain region 23c and further subtract those background charges from the signal charge components, which result from the first transfer gate electrode 16a and the second transfer gate electrode 16b. Thus, it is possible to suppress the influence of the background light. Therefore, since the influence of the background light can be suppressed, the shot noise caused by the background charges can be suppressed, thereby achieving a high range measurement precision (distance resolution) and the maximum range measurement coverage.

Moreover, according to the semiconductor range-finding element according to the second embodiment, it is possible to protect the background charges from being accumulated in the first floating drain region 23a and the second floating drain region 23b, and it is possible to maximally use the capacities of the first floating drain region 23a and the second floating drain region 23b and accumulate the signal charges. Thus, it is possible to attain the wide dynamic range. Moreover, when the dynamic range is represented by the maximal value for the signal and the noise level, the noise caused by the background charges is decreased, thereby increasing the dynamic range.

Figure 7:
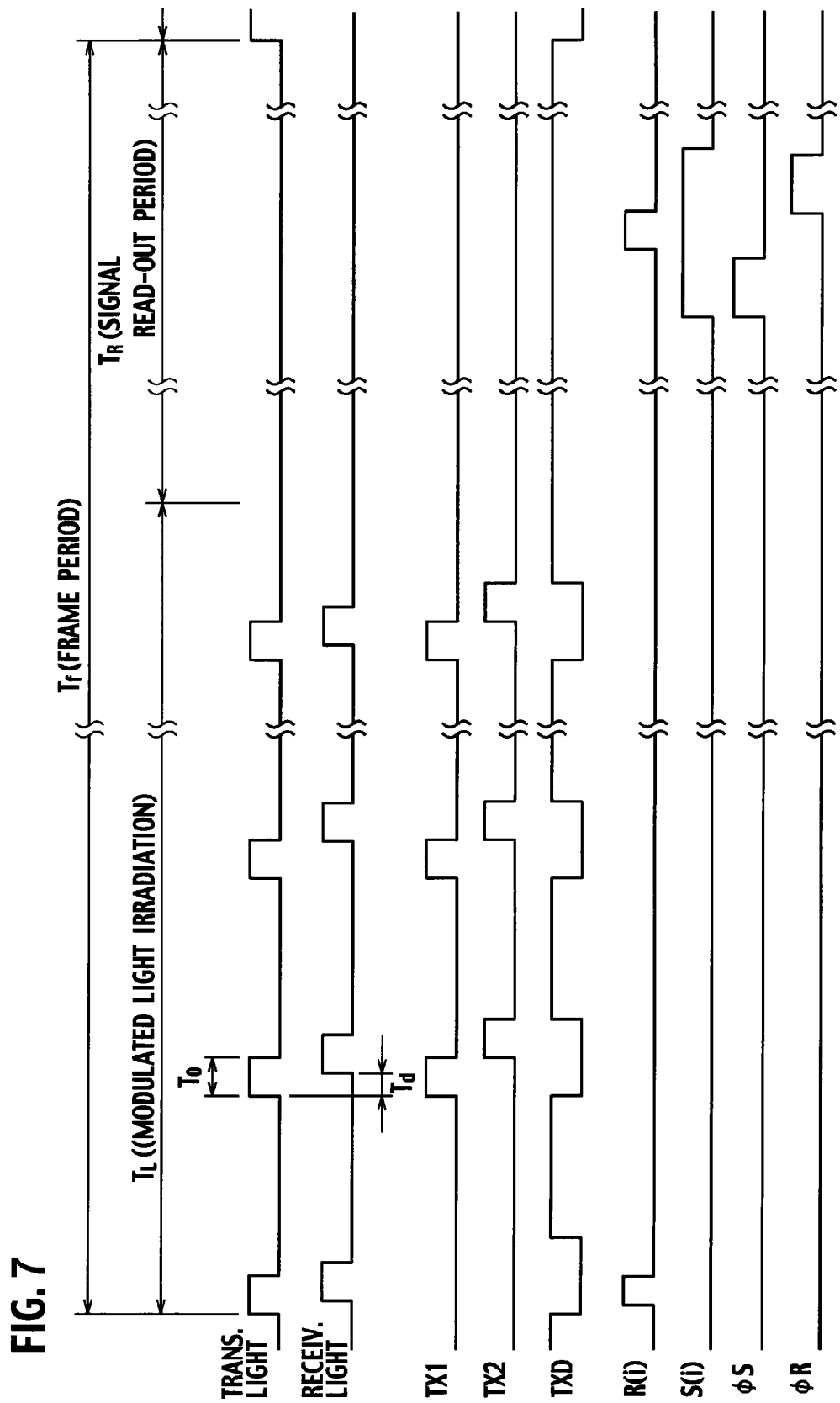
FIG. 7 is a timing chart describing the operations of the solid-state imaging device according to the first embodiment shown in FIG. 1.

By the way, when the semiconductor range-finding element according to the second embodiment is employed as the pixel so as to implement a range-finding sensor, based on the two-dimensional array of the pixels, with regard to the entire configuration of the range-finding sensor and the entire operation thereof, an extra circuit for reading the background light component may be added to the configuration shown in FIG. 1 and FIG. 7 in the first embodiment. Although the detail is omitted, similarly to the solid-state imaging device according to the first embodiment, since the influence of the background light can be suppressed in each of the pixels, the shot noise caused by the background charges can be suppressed, thereby achieving a high range measurement precision (distance resolution) and the maximum range measurement coverage. Moreover, according to the semiconductor range-finding element according to the second embodiment, in each of the pixels, it is possible to protect the background charges from being accumulated in the first floating drain region 23a and the second floating drain region 23b, and it is possible to maximally use the capacities of the first floating drain region 23a and the second floating drain region 23b and accumulate the signal charges. Thus, it is possible to attain the wide dynamic range. Moreover, when the dynamic range is represented by the maximal value for the signal and the noise level, the noise caused by the background charges is decreased, thereby increasing the dynamic range.

Third Embodiment

The entire configuration of a solid-state imaging device (two-dimensional image sensor) according to the third embodiment of the present invention is equivalent to the block diagram shown in FIG. 1. Thus, the overlapping or redundant description is omitted. However, the structure of the semiconductor range-finding element, which has the cross-sectional structure shown in FIG. 14 and serves as the TOF pixel circuit 81 assigned in each of the pixels $X_{11}$ to $X_{1m}$, $X_{21}$ to $X_{2m}$, - - - , $X_{n1}$ to $X_{nm}$ in the solid-state imaging device according to the third embodiment, differs from the cross-sectional structure of the semiconductor range-finding element according to the first embodiment, in that the semiconductor range-finding element according to the third embodiment does not contain the surface buried region 22. However, since the planar configuration is similar to the planar configuration of the semiconductor range-finding element according to the first embodiment shown in FIG. 2, the overlapping or redundant description is omitted.

FIG. 14(a) corresponds to the cross-sectional configuration viewed from the A-A direction of the semiconductor range-finding element, which has been shown in FIG. 2, and shows a semiconductor substrate 19 of the first conductivity type (p-type) and a semiconductor layer (epitaxial growth layer) 20 of the first conductivity type (p-type) formed on the semiconductor substrate 19. A semiconductor photoelectric conversion element is implemented by an insulating film 31 directly under the central light-receiving gate electrode 11, the semiconductor layer (epitaxial growth layer) 20 and the semiconductor substrate 19. A part of the semiconductor layer (epitaxial growth layer) 20 of the first conductivity type (p-type) located directly under the light-receiving gate electrode 11 serves as a charge generation region of the semiconductor photoelectric conversion element.

The insulating film 31 extends from directly under the light-receiving gate electrode 11 to under the first transfer gate electrode 16a and the second transfer gate electrode 16b in the right and left portion. Below the insulating film 31, the semiconductor layer (epitaxial growth layer) 20 is arranged to extend from directly under the light-receiving gate electrode 11 to under the first transfer gate electrode 16a and the second transfer gate electrode 16b in the right and left directions. That is, a portion located directly under the first transfer gate electrode 16a in a part of the semiconductor layer (epitaxial growth layer) 20 on the right side of the semiconductor layer (epitaxial growth layer) 20 serving as a charge generation region directly under the light-receiving gate electrode 11 serves as the first transfer channel. On the other hand, a portion located directly under the second transfer gate electrode 16b in another part of the semiconductor layer (epitaxial growth layer) 20 adjacent to the left side of the semiconductor layer (epitaxial growth layer) 20 directly under the light-receiving gate electrode 11 (directly over the charge generation region) serves as a second transfer channel. Then, the first transfer gate electrode 16a and the second transfer gate electrode 16b electrostatically control the potentials of the first and second transfer channels through the insulating films 31 formed on those first and second transfer channels, respectively, and transfer the signal charges alternately through the first and second transfer channels to the first floating drain region 23a and the second floating drain region 23b of the second conductivity type (n-type), respectively.

FIG. 14(b) is the cross-sectional configuration viewed from the B-B direction of the semiconductor range-finding element, which has been shown in FIG. 2, and shows the semiconductor substrate 19 of the first conductivity type (p-type) and the semiconductor layer (epitaxial growth layer) 20 of the first conductivity type (p-type) formed on the semiconductor substrate 19. The semiconductor photoelectric conversion element is implemented by the insulating film 31 directly under the central light-receiving gate electrode 11, the semiconductor layer (epitaxial growth layer) 20 and the semiconductor substrate 19. A part of the semiconductor layer (epitaxial growth layer) 20 of the first conductivity type (p-type) located directly under the light-receiving gate electrode 11 serves as the charge generation region of the semiconductor photoelectric conversion element.

The insulating film 31 extends from directly under the light-receiving gate electrode 11 to under a first exhausting gate electrode 12a and a second exhausting gate electrode 12b in the right and left portions of FIG. 14(b) (corresponding to the upper and lower directions of FIG. 2). Below the insulating film 31, the semiconductor layer (epitaxial growth layer) 20 is arranged to extend from directly under the light-receiving gate electrode 11 to under the first exhausting gate electrode 12a and the second exhausting gate electrode 12b in the right and left directions. That is, a portion located directly under the first exhausting gate electrode 12a, which is another part of the semiconductor layer (epitaxial growth layer) 20 adjacent to the right side of the semiconductor layer (epitaxial growth layer) 20 directly under the light-receiving gate electrode 11 (directly over the charge generation region), serves as the first exhausting channel. On the other hand, a portion located directly under the second exhausting gate electrode 12b, which is a still another part of the semiconductor layer (epitaxial growth layer) 20 adjacent to the left side of the semiconductor layer (epitaxial growth layer) 20 directly under the light-receiving gate electrode 11 (directly over the charge generation region), serves as a second exhausting channel. Then, the first exhausting gate electrode 12a and the second exhausting gate electrode 12b electrostatically control the potentials of the first and second exhausting channels through the insulating films 31 formed on those first and second exhausting channels, respectively, and transfer the background charges through the first and second exhausting channels to the first exhausting drain region 21a and the second exhausting drain region 21b of the second conductivity type (n-type), respectively. In the cross-sectional structure shown in FIG. 14(a) and FIG. 14(b), the impurity concentration of the semiconductor layer 20 serving as the charge generation region is lower than the impurity concentration of the semiconductor substrate 19. That is, the semiconductor substrate 19 is preferred to have the impurity concentration of about $4 \times 10^{17}$ cm$^{-3}$ or more and about $1 \times 10^{21}$ cm$^{-3}$ or less, and the semiconductor layer (epitaxial growth layer) 20 serving as the charge generation region is preferred to have the impurity concentration of about $6 \times 10^{11}$ cm$^{-3}$ or more and about $2 \times 10^{15}$ cm$^{-3}$ or less. In particular, when the semiconductor substrate 19 is a silicon substrate having the impurity concentration of about $4 \times 10^{17}$ cm$^{-3}$ or more and about $1 \times 10^{21}$ cm$^{-3}$ or less, and the semiconductor layer (epitaxial growth layer) 20 is elected to be a silicon epitaxial growth layer 20 having the impurity concentration of about $6 \times 10^{11}$ cm$^{-3}$ or more and about $2 \times 10^{15}$ cm$^{-3}$ or less, conventional CMOS process can be employed. From the viewpoint of industrial meaning, in the case of the semiconductor substrate 19 having the impurity concentration of about $8 \times 10^{17}$ cm$^{-3}$ or more and about $1 \times 10^{20}$ cm$^{-3}$ or less and the silicon epitaxial semiconductor layer 20 having the impurity concentration of about $6 \times 10^{13}$ cm$^{-3}$ or more and about $1.5 \times 10^{15}$ cm$^{-3}$ or less, the availability on the market is easy, and these device parameters are preferable. The thickness of the silicon epitaxial semiconductor layer 20 may be between about 4 and 20 μm and preferably between about 6 and 10 μm. The semiconductor layers (epitaxial growth layers) 20 located directly under the light-receiving gate electrode 11 and directly under the first transfer gate electrode 16a and the second transfer gate electrode 16b in the right and left portions are the regions in which the p-wells and n-wells, being essential in conventional CMOS process, are not provided.

The others are substantially similar to the semiconductor range-finding element according to the first embodiment. Thus, the overlapping or redundant description is omitted. However, similarly to the semiconductor range-finding element according to the first embodiment, even by the semiconductor range-finding element according to the third embodiment, the influence of the background light can be effectively reduced, thereby achieving a high range measurement precision (distance resolution), a wide maximum range measurement coverage and a wide dynamic range.

Also, even in the solid-state imaging device based on the two-dimensional array when the semiconductor range-finding element according to the third embodiment is configured as the pixel, similarly to the solid-state imaging device according to the first embodiment, the influence of the background light can be effectively reduced, thereby achieving a high range measurement precision (distance resolution), a wide maximum range measurement coverage and a wide dynamic range.

Fourth Embodiment

The entire organization of the solid-state imaging device (two-dimensional image sensor) according to the fourth embodiment of the present invention is equivalent to the block diagram shown in FIG. 1. Thus, the overlapping or redundant description is omitted. However, a structure of the semiconductor range-finding element, which has a cross-sectional structure shown in FIG. 15 and serves as the TOF pixel circuit 81 assigned in each of the pixels $X_{11}$ to $X_{1m}$, $X_{21}$ to $X_{2m}$, - - - , $X_{n1}$ to $X_{nm}$ in the solid-state imaging device according to the fourth embodiment, differs from the cross-sectional structure of the semiconductor range-finding element according to the third embodiment, in that a semiconductor substrate 18 of the first conductivity type (p-type) replaces the stacked structure of "the semiconductor substrate 19 and the semiconductor layer (epitaxial growth layer) 20 arranged on the semiconductor substrate 19". However, since the planar configuration is similar to the planar configuration of the semiconductor range-finding element according to the first embodiment shown in FIG. 2, the overlapping or redundant description is omitted. In the cross-sectional structure shown in FIG. 15, the semiconductor substrate 18 is preferred to have the impurity concentration of $6 \times 10^{11}$ cm$^{-3}$ or more and $2 \times 10^{15}$ cm$^{-3}$ or less.

FIG. 15(a) corresponds to the cross-sectional configuration viewed from the A-A direction of the semiconductor range-finding element, which has been shown in FIG. 2, and an insulating film 31 directly under the central light-receiving gate electrode 11 and the semiconductor substrate 18 implements a semiconductor photoelectric conversion element. A part of the semiconductor substrate 18 of the first conductivity type (p-type) located directly under the light-receiving gate electrode 11 serves as a charge generation region of the charge generation region. Then, a portion located directly under the first transfer gate electrode 16a, which is a part of the semiconductor substrate 18 on the right side of the semiconductor substrate 18 serving as the charge generation region directly under the light-receiving gate electrode 11, serves as the first transfer channel. On the other hand, a part located directly under the second transfer gate electrode 16b, which is another part of the semiconductor substrate 18 adjacent to the left side of the semiconductor substrate 18 directly under the light-receiving gate electrode 11, serves as a second transfer channel. Then, the first transfer gate electrode 16a and the second transfer gate electrode 16b electrostatically control the potentials of the first and second transfer channels through the insulating films 31 formed on those first and second transfer channels, respectively, and transfer the signal charges alternately through the first and second transfer channels to the first floating drain region 23a and the second floating drain region 23b of the second conductivity type (n-type), respectively.

FIG. 15(b) is the cross-sectional structure viewed from the B-B direction of the semiconductor range-finding element, which has been shown in FIG. 2. A portion located directly under the first exhausting gate electrode 12a, which is a still another part of the semiconductor substrate 18 adjacent to the right side of the semiconductor substrate 18 directly under the light-receiving gate electrode 11, serves as a first exhausting channel. The portion located directly under the second exhausting gate electrode 12b, which is a yet still another part of the semiconductor substrate 18 adjacent to the left side of the semiconductor substrate 18 directly under the light-receiving gate electrode 11, serves as a second exhausting channel. Then, the first exhausting gate electrode 12a and the second exhausting gate electrode 12b electrostatically control the potentials of the first and second exhausting channels through the insulating films 31 formed on those first and second exhausting channels, respectively, and transfer the background charges through the first and second exhausting channels to the first floating drain region 23a and the second floating drain region 23b of the second conductivity type (n-type), respectively.

The others are substantially similar to the semiconductor range-finding element according to the first embodiment. Thus, the overlapping or redundant description is omitted. However, similarly to the semiconductor range-finding element according to the first embodiment, even by the semiconductor range-finding element according to the fourth embodiment, the influence of the background light can be effectively reduced, thereby achieving a high range measurement precision (distance resolution), a wide maximum range measurement coverage and a wide dynamic range.

Also, even in the solid-state imaging device based on the two-dimensional array when the semiconductor range-finding element according to the fourth embodiment is configured as the pixel, similarly to the solid-state imaging device according to the first embodiment, the influence of the background light can be effectively reduced, thereby achieving a high range measurement precision (distance resolution), a wide maximum range measurement coverage and a wide dynamic range.

Other Embodiments

Figure 16:
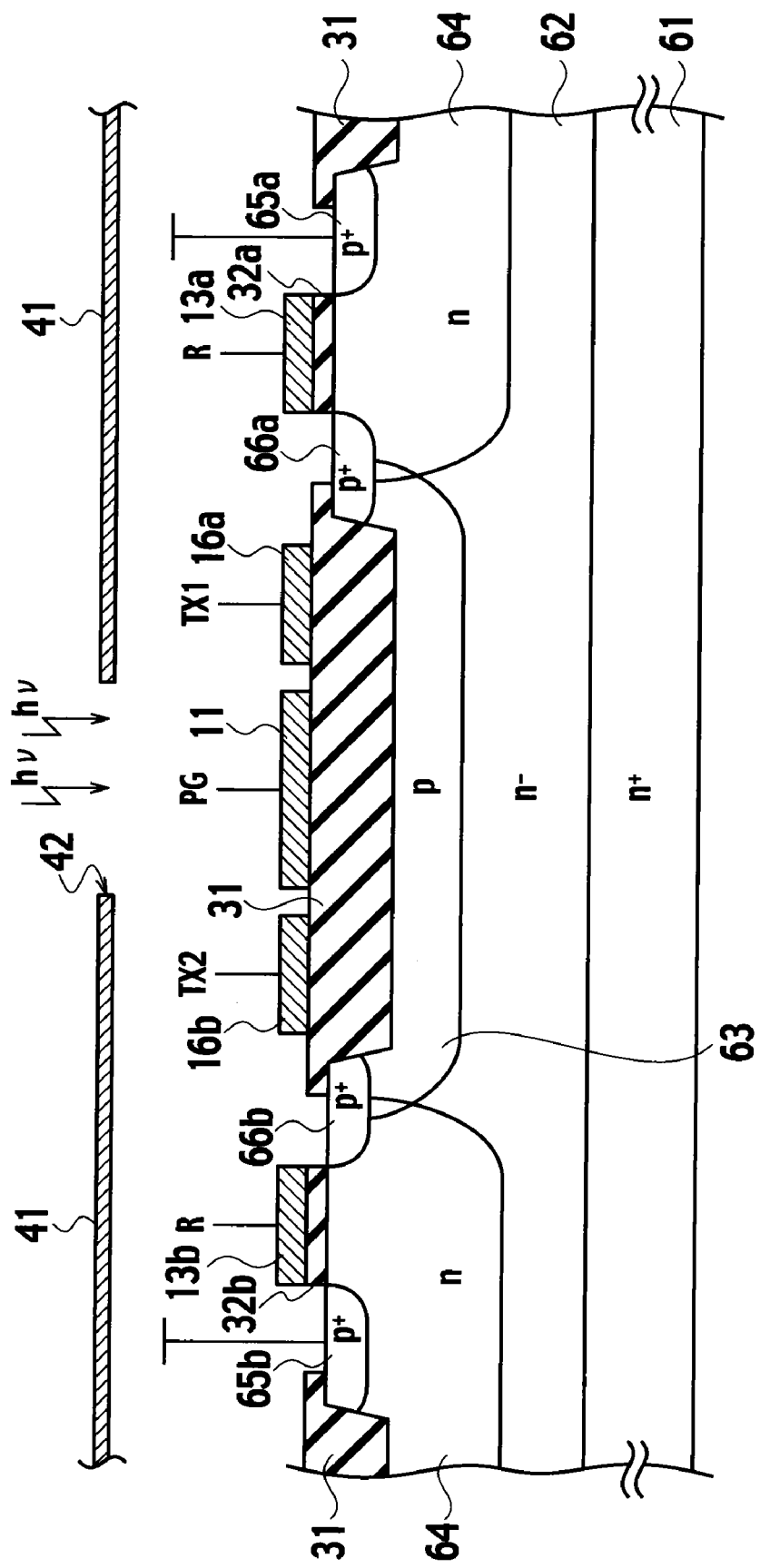
FIG. 16 is a diagrammatic cross-sectional view describing a schematic configuration of a semiconductor range-finding element serving as a part of pixels in a solid-state imaging device according to another embodiment of the present invention.

While the present invention is described in accordance with the aforementioned first through the fourth embodiments, it should not be understood that the description and drawings that implement a part of the disclosure are to limit the scope of the present invention. This disclosure makes clear a variety of alternative embodiments, examples and operational techniques for those skilled in the art. For example, in the description of the first to fourth embodiments as mentioned above, the first conductivity type is explained as the p-type, and the second conductivity type is explained as the n-type. However, as shown in FIG. 16, even if the first conductivity type is elected to be the p-type and the second conductivity type is elected to be the n-type, when the electric polarities are inverted, the fact that the similar effectiveness can be obtained may be easily understood. The entire organization of the solid-state imaging device (two-dimensional image sensor) in which the semiconductor range-finding element, which has been shown in FIG. 16 is defined as the pixel is equivalent to the block diagram shown in FIG. 1. Thus, the overlapping or redundant description is omitted. Also, the planar configuration is similar to the planar configuration of the semiconductor range-finding element according to the first embodiment shown in FIG. 2. Hence, the overlapping or redundant description is omitted.

FIG. 16 corresponds to the cross-sectional configuration viewed from the A-A direction of the semiconductor range-finding element, which has been shown in FIG. 2, which is used to describe the solid-state imaging device according to the first embodiment, and shows a semiconductor substrate 61 of a first conductivity type (n-type), a semiconductor layer (epitaxial growth layer) 62 of the first conductivity type (n-type) formed on the semiconductor substrate 61, and a surface buried region 63 of a second conductivity type (p-type) formed on the semiconductor layer (epitaxial growth layer) 62. The semiconductor photoelectric conversion element is implemented by the insulating film 31 directly under the central light-receiving gate electrode 11, the surface buried region 63, the semiconductor layer (epitaxial growth layer) 62 and the semiconductor substrate 61. A part of the semiconductor layer (epitaxial growth layer) 62 of the first conductivity type (n-type) located directly under the light-receiving gate electrode 11 serves as the charge generation region of the semiconductor photoelectric conversion element. The carriers (holes) generated in the charge generation region are injected into the sub-area of the surface buried region 63 directly over the charge generation region.

The insulating film 31 extends from directly under the light-receiving gate electrode 11 to under the first transfer gate electrode 16a and the second transfer gate electrode 16b in the right and left portion. Below the insulating film 31, the surface buried region 63 is arranged to extend from directly under the light-receiving gate electrode 11 to under the first transfer gate electrode 16a and the second transfer gate electrode 16b in the right and left directions. That is, in the surface buried region (another sub-area of the surface buried region 63) 63 adjacent to the right side of the surface buried region 63 directly under the light-receiving gate electrode 11 (directly over the charge generation region), the site located directly under the first transfer gate electrode 16a serves as a first transfer channel. On the other hand, in the surface buried region (a still another sub-area of the surface buried region 63) 63 adjacent to the left side of the surface buried region 63 directly under the light-receiving gate electrode 11 (directly over the charge generation region), the site located directly under the second transfer gate electrode 16b serves as a second transfer channel. Then, the first transfer gate electrode 16a and the second transfer gate electrode 16b electrostatically control the potentials of the first and second transfer channels through the insulating films 31 formed on those first and second transfer channels, respectively, and transfer the signal charges alternately through the first and second transfer channels to the first floating drain region 23a and the second floating drain region 23b of the second conductivity type (p-type), respectively. Each of the first floating drain region 23a and the second floating drain region 23b is the semiconductor region of the higher impurity concentration than the surface buried region 63. As evident from FIG. 16, the surface buried region 63 is formed to contact with the first floating drain region 23a and the second floating drain region 23b in the right and left portions.

Although the illustration of the cross-sectional configuration viewed from the B-B direction of the semiconductor range-finding element, which has been shown in FIG. 2 is omitted, similarly to FIG. 4, a portion located directly under the first exhausting gate electrode 12a, which is the surface buried region (another sub-area of the surface buried region 63) adjacent to the right side of the surface buried region 63 directly under the light-receiving gate electrode 11 (directly over the charge generation region), serves as a first exhausting channel located directly under the first exhausting gate electrode 12a. On the other hand, a portion located directly under the second exhausting gate electrode 12b, which is the surface buried region (a still another sub-area of the surface buried region 63) adjacent to the left side of the surface buried region 63 directly under the light-receiving gate electrode 11 (directly over the charge generation region), serves as a second exhausting channel located directly under the second exhausting gate electrode 12b. Then, the first exhausting gate electrode 12a and the second exhausting gate electrode 12b electrostatically control the potentials of the first and second exhausting channels through the insulating films 31 formed on those first and second exhausting channels, respectively, and transfer the background charges through the first and second exhausting channels to the first exhausting drain region 21a and the second exhausting drain region 21b of the second conductivity type (p-type), respectively. The above explanation may be easily understood.

Also, in the description of the first to fourth embodiments as mentioned above, the TOF range-finding sensor as the two-dimensional solid-state imaging device (area sensor) has been exemplified. However, the semiconductor range-finding element of the present invention should not be limitedly construed to be used only for the pixel of the two-dimensional solid-state imaging device.

For example, in the two-dimensional matrix shown in FIG. 1, as the pixel of the one-dimensional solid-state imaging device (line sensor) in which j=m=1 is defined, the organization in which the plurality of semiconductor range-finding elements may be one-dimensionally arrayed must be easily understood from the above-mentioned disclosed contents.

As such, the present invention may naturally include various embodiments not described herein. Therefore, the technical scope of the present invention should be defined only by features for specifying the invention according to the appended claims that are regarded appropriate according to the above description.

INDUSTRIAL APPLICABILITY

According to the present invention, the influence of the background light can be effectively reduced. Thus, it is possible to provide the TOF type semiconductor range-finding element that has the high range measurement precision (distance resolution), a wide maximum range measurement coverage and a wide dynamic range, and the TOF type solid-state imaging device in which the TOF type semiconductor range-finding elements are arrayed one-dimensionally or two-dimensionally. Thus, the semiconductor range-finding element of the present invention can be applied to the field of a range-finding sensor for a car and the field to obtain or prepare a three-dimensional picture. Moreover, the solid-state imaging device of the present invention can be applied even to the a fields for analyzing movement of a sport player and the game machine in which the three-dimensional picture is used.

The invention claimed is:

1. A semiconductor range-finding element, comprising:
a semiconductor photoelectric conversion element configured to receive an optical pulse, which is reflected by a target sample, as an optical signal, and configured to convert into signal charges in a charge generation region;
first and second transfer gate electrodes configured to electrostatically control potentials of first and second transfer channels implemented by a same semiconductor region as the charge generation region through insulating films formed on the first and second transfer channels, respectively, and configured to alternately transfer the signal charges generated in the charge generation region, through the first and second transfer channels;
first and second floating drain regions configured to accumulate the signal charges transferred by the first and second transfer gate electrodes, sequentially and respectively;
a first exhausting gate electrode configured to electrostatically control a potential of a first exhausting channel implemented by the same semiconductor region as the charge generation region through the insulating film formed on the first exhausting channel and configured to receive a background light and then to exhaust background charges generated in the charge generation region; and
a first exhausting drain region configured to receive the background charges exhausted by the first exhausting gate electrode,
wherein, by sequentially applying control pulse signals to the first gate electrode, the second transfer gate electrode and the first exhausting gate electrode in synchronization with the optical pulse so as to operate the first gate electrode, the second transfer gate electrode and the first exhausting gate electrode, a range to the target sample is measured in accordance with a distribution ratio between the charges accumulated in the first and second floating drain regions.

2. The semiconductor range-finding element according to claim 1, wherein a pulse width of the control pulse signal applied to the first exhausting gate electrode is longer than pulse widths of the control pulse signals applied to the first and second transfer gate electrodes.

3. The semiconductor range-finding element according to claim 1, wherein a transfer direction of the signal charges and a exhausting direction of the background charges are orthogonal.

4. The semiconductor range-finding element according to claim 1, further comprising:
a second exhausting gate electrode, which is opposite to the first exhausting gate electrode in a direction orthogonal to the transfer direction of the signal charges, configured to electrostatically control a potential of a second exhausting channel implemented by the same semiconductor region as the charge generation region, through the insulating film formed on the second exhausting channel, and configured to exhaust the background charges to a direction opposite to the background charges running through the first exhausting channel; and a second exhausting drain region configured to receive the background charges exhausted by the second exhausting gate electrode.

5. The semiconductor range-finding element according to claim 1, further comprising:
a third transfer gate electrode configured to electrostatically control a potential of a third transfer channel implemented by the same semiconductor region as the charge generation region, through an insulating film formed on the third transfer channel, and configured to transfer the background charges through the third transfer channel; and
a third floating drain region configured to accumulate the background charges transferred by the third transfer gate electrode.

6. The semiconductor range-finding element according to claim 1, wherein thicknesses of the insulating films formed on the first and second transfer channels, respectively, are 150 nm or more and 1000 nm or less, in terms of a dielectric constant of a thermally oxidized film.

7. The semiconductor range-finding element according to claim 1, wherein:
the charge generation region, the first transfer channel, the second transfer channel and the first exhausting channel are formed of an epitaxial growth layer, which is lower in impurity concentration than a semiconductor substrate and has the same conductivity type as the semiconductor substrate; and
the first floating drain region, the second floating drain region and the first exhausting drain region are implemented by semiconductor regions having the conductivity type opposite to the semiconductor substrate.

8. The semiconductor range-finding element according to claim 1, wherein:
the charge generation region, the first transfer channel, the second transfer channel and the first exhausting channel are implemented by surface buried regions, which are lower in impurity concentration than a semiconductor substrate and have the conductivity type opposite to the semiconductor substrate, through an epitaxial growth layer grown on the semiconductor substrate, the epitaxial growth layer having the same conductivity type as the semiconductor substrate; and
the first floating drain region, the second floating drain region and the first exhausting drain region are implemented by semiconductor regions, which have the conductivity type opposite to the semiconductor substrate and are high in impurity concentration than the surface buried regions.

9. A solid-state imaging device, having a plurality of pixels arrayed in a one-dimensional direction, wherein each of the pixels comprises:
a semiconductor photoelectric conversion element configured to receive an optical pulse, which is reflected by a target sample, as an optical signal, and configured to convert into signal charges in a charge generation region;
first and second transfer gate electrodes configured to electrostatically control potentials of first and second transfer channels implemented by a same semiconductor region as the charge generation region through insulating films formed on the first and second transfer channels, respectively, and configured to alternately transfer the signal charges generated in the charge generation region through the first and second transfer channels;
first and second floating drain regions configured to accumulate the signal charges transferred by the first and second transfer gate electrodes, sequentially and respectively;
a first exhausting gate electrode configured to electrostatically control a potential of a first exhausting channel implemented by the same semiconductor region as the charge generation region through the insulating film formed on the first exhausting channel and configured to receive a background light and then to exhaust background charges generated in the charge generation region; and
a first exhausting drain region configured to receive the background charges exhausted by the first exhausting gate electrode,
wherein control pulse signals are sequentially applied to the first gate electrode, the second transfer gate electrode and the first exhausting gate electrode in all of the pixels, in synchronization with the optical pulse, and
in each of the pixels, a range to the target sample is measured in accordance with a distribution ratio between the charges accumulated in the first and second floating drain regions.

10. A solid-state imaging device, having a plurality of pixels arrayed in a shape of a two-dimensional matrix, wherein each of the pixels comprises:
a semiconductor photoelectric conversion element configured to receive an optical pulse, which is reflected by a target sample, as an optical signal, and configured to convert into signal charges in a charge generation region;
first and second transfer gate electrodes configured to electrostatically control potentials of first and second transfer channels implemented by a same semiconductor region as the charge generation region, through insulating films formed on the first and second transfer channels, respectively, and configured to alternately transfer the signal charges generated in the charge generation region, through the first and second transfer channels;
first and second floating drain regions configured to accumulate the signal charges transferred by the first and second transfer gate electrodes, sequentially and respectively;
a first exhausting gate electrode configured to electrostatically control a potential of a first exhausting channel implemented by the same semiconductor region as the charge generation region, through the insulating film formed on the first exhausting channel and configured to receive a background light and then to exhaust background charges generated in the charge generation region; and
a first exhausting drain region configured to receive the background charges exhausted by the first exhausting gate electrode,
wherein control pulse signals are sequentially applied to the first gate electrode, the second transfer gate electrode and the first exhausting gate electrode in all of the pixels, in synchronization with the optical pulse, and
in each of the pixels, a range to the target sample is measured in accordance with a distribution ratio between the charges accumulated in the first and second floating drain regions, and all of the pixels are two-dimensionally accessed, and a two-dimensional picture corresponding to the measured ranges is obtained.

11. The solid-state imaging device according to claim 9, wherein a pulse width of the control pulse signal applied to the first exhausting gate electrode is longer than pulse widths of the control pulse signals applied to the first and second transfer gate electrodes.

12. The solid-state imaging device according to claim 9, wherein a transfer direction of the signal charges and a exhausting direction of the background charges are orthogonal.

13. The solid-state imaging device according to claim 9, further comprising:
   a second exhausting gate electrode, which is opposite to the first exhausting gate electrode in a direction orthogonal to the transfer direction of the signal charges, configured to electrostatically control a potential of a second exhausting channel implemented by the same semiconductor region as the charge generation region, through the insulating film formed on the second exhausting channel, and configured to exhaust the background charges to a direction opposite to the background charges running through the first exhausting channel; and
   a second exhausting drain region configured to receive the background charges exhausted by the second exhausting gate electrode.

14. The solid-state imaging device according to claim 9, further comprising:
   a third transfer gate electrode configured to electrostatically control a potential of a third transfer channel implemented by the same semiconductor region as the charge generation region, through an insulating film formed on the third transfer channel, and configured to transfer the background charges through the third transfer channel; and
   a third floating drain region configured to accumulate the background charges transferred by the third transfer gate electrode.

15. The solid-state imaging device according to claim 9, wherein thicknesses of the insulating films formed on the first and second transfer channels, respectively, are 150 nm or more and 1000 nm or less, in terms of a dielectric constant of a thermally oxidized film.

16. The solid-state imaging device according to claim 9, wherein:
   the charge generation region, the first transfer channel, the second transfer channel and the first exhausting channel are formed of an epitaxial growth layer, which are lower in impurity concentration than a semiconductor substrate and has the same conductivity type as the semiconductor substrate; and
   the first floating drain region, the second floating drain region and the first exhausting drain region are implemented by semiconductor regions having the conductivity type opposite to the semiconductor substrate.

17. The solid-state imaging device according to claim 9, wherein:
   the charge generation region, the first transfer channel, the second transfer channel and the first exhausting channel are implemented by surface buried regions, which are lower in impurity concentration than a semiconductor substrate and have the conductivity type opposite to the semiconductor substrate, through an epitaxial growth layer grown on the semiconductor substrate, the epitaxial growth layer having the same conductivity type as the semiconductor substrate; and
   the first floating drain region, the second floating drain region and the first exhausting drain region are implemented by semiconductor regions, which have the conductivity type opposite to the semiconductor substrate and are high in impurity concentration than the surface buried regions.

18. The solid-state imaging device according to claim 9, wherein:
   the insulating film is an oxide film formed by a step of forming a field oxide film of a CMOS integrated circuit; and
   the semiconductor photoelectric conversion element, the first transfer gate electrode, the second transfer gate electrode, the first floating drain region and the second floating drain region are formed as steps for manufacturing the CMOS integrated circuit.

19. The solid-state imaging device according to claim 9, wherein the pixel is connected to each of the first and second floating drain regions and further comprises a voltage-readout buffer configured to read the charges accumulated in each of the first and second floating drain regions.

20. The solid-state imaging device according to claim 9, wherein the pixel further comprises:
   a first reset gate electrode adjacent to the first floating drain region on a planar pattern;
   a first reset source region opposite to the first floating drain region, with respect to the first reset gate electrode;
   a second reset gate electrode adjacent to the second floating drain region on the planar pattern; and
   a second reset source region opposite to the second floating drain region, with respect to the second reset gate electrode,
   wherein the charges accumulated in the first and second floating drain regions, by applying a reset signal to the first and second reset gate electrodes, are discharged to the first and second reset source regions, respectively, and the first and second floating drain regions are reset.

* * * * *